(12) United States Patent
Lee et al.

(10) Patent No.: US 11,106,299 B2
(45) Date of Patent: Aug. 31, 2021

(54) TOUCH DISPLAY PANEL AND TOUCH DISPLAY DEVICE

(71) Applicant: LG Display Co., Ltd., Seoul (KR)

(72) Inventors: HwiDeuk Lee, Gyeongsangbuk-do (KR); Yangsik Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/512,818

(22) Filed: Jul. 16, 2019

(65) Prior Publication Data

US 2020/0026385 A1    Jan. 23, 2020

(30) Foreign Application Priority Data

Jul. 20, 2018    (KR) .......................... 10-2018-0084695

(51) Int. Cl.
*G06F 3/044* (2006.01)
*G06F 3/041* (2006.01)

(52) U.S. Cl.
CPC ............ *G06F 3/0412* (2013.01); *G06F 3/044* (2013.01); *G06F 3/0416* (2013.01)

(58) Field of Classification Search
CPC ...... G06F 3/0412; G06F 3/0416; G06F 3/044; G06F 2203/04107; H01L 27/323
See application file for complete search history.

(56) References Cited

U.S. PATENT DOCUMENTS

| | | | | |
|---|---|---|---|---|
| 2004/0085013 | A1* | 5/2004 | Han | ...................... H05B 33/04 |
| | | | | 313/503 |
| 2018/0011385 | A1* | 1/2018 | Kang | .................. H01L 51/0094 |
| 2018/0032189 | A1* | 2/2018 | Lee | ........................ G06F 3/0443 |
| 2018/0129352 | A1* | 5/2018 | Kim | ...................... G06F 3/0443 |
| 2018/0329555 | A1* | 11/2018 | Kim | ..................... G09G 3/3208 |
| 2019/0129555 | A1* | 5/2019 | Chiang | ................. G06F 3/0448 |

OTHER PUBLICATIONS

Extended European Search Report dated Nov. 13, 2019, issued in European Patent Application No. 19187127.6.

* cited by examiner

*Primary Examiner* — Carolyn R Edwards
(74) *Attorney, Agent, or Firm* — Morgan, Lewis & Bockius LLP

(57) ABSTRACT

A touch display device includes a substrate defining an active area and a non-active area around the active area; a touch pad in the non-active area; a plurality of signal lines; a signal line insulation layer; first electrodes; at least one noise reduction electrode on the signal line insulation layer and in a portion other than the area corresponding to the first electrodes; a second electrode over the plurality of first electrodes and the at least one noise reduction electrode; an encapsulation layer on the second electrode; touch lines on the encapsulation layer and connected to the touch pad; and touch electrodes on the encapsulation layer and electrically connected to at least one touch line. The encapsulation layer has a sloped surface between the touch pad and the touch electrodes, and the touch lines are arranged on the sloped surface of the encapsulation layer having a corresponding slope.

17 Claims, 19 Drawing Sheets

TOUCH DISPLAY PANEL AND TOUCH DISPLAY DEVICE

This application claims priority from Korean Patent Application No. 10-2018-0084695, filed on Jul. 20, 2018, which is hereby incorporated by reference for all purposes as if fully set forth herein.

BACKGROUND

Technical Field

Embodiments of the present disclosure relate to a touch display panel and a touch display device.

Description of the Related Art

The advent of the information society has brought growing demand for display devices for displaying images, and various types of display devices, such as a liquid crystal display device, an organic light-emitting display device, and the like, are being utilized. To provide a variety of functions to users, display devices provide functions of recognizing a finger touch or a pen touch of a user on the display panel and performing an input process on the basis of the recognized touch.

For example, a display device capable of recognizing a touch may include a plurality of touch electrodes arranged on or embedded in a display panel, and may drive the touch electrodes, thereby detecting whether or not a user's touch is performed on the display panel, the touch coordinates, and the like. However, because electrodes and signal lines, to which various voltages and signals for driving the display are applied, are arranged on the display panel, which provides a touch recognition function, parasitic capacitance generated between the display electrode and the touch electrode may degrade the performance of touch sensing.

SUMMARY

Accordingly, embodiments of the present disclosure are directed to a touch display panel and a touch display device that substantially obviate one or more of the problems due to limitations and disadvantages of the related art.

An aspect of the present disclosure is to provide a touch display panel and a touch display device capable of reducing the noise of a touch-sensing signal, which may be caused by the parasitic capacitance between a touch electrode and an electrode for driving a display.

Another aspect of the present disclosure is to provide a touch display panel and a touch display device capable of minimizing or reducing the influence of noise caused by a signal line or an electrode, to which a signal for driving a display is applied, on a touch electrode through a display electrode adjacent to the touch electrode.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a touch display device comprises a substrate defining an active area having a plurality of subpixels therein and a non-active area around the active area; a touch pad on the substrate in the non-active area; a plurality of signal lines on the substrate; a signal line insulation layer on the plurality of signal lines; a plurality of first electrodes on the signal line insulation layer; at least one noise reduction electrode on the signal line insulation layer and in at least a portion of an area other than the area corresponding to the plurality of first electrodes; a second electrode over the plurality of first electrodes and the at least one noise reduction electrode; an encapsulation layer on the second electrode; a plurality of touch lines on the encapsulation layer and electrically connected to the touch pad; and a plurality of touch electrodes on the encapsulation layer and electrically connected to at least one of the plurality of touch lines, wherein the encapsulation layer has a sloped surface between the touch pad and the touch electrodes, and wherein the plurality of touch lines is arranged on the sloped surface of the encapsulation layer to have a slope corresponding to the sloped surface of the encapsulation layer.

In another aspect, a touch display panel comprises a substrate; a plurality of signal lines on the substrate; a signal line insulation layer on the plurality of signal lines; a plurality of first electrodes on the signal line insulation layer; at least one noise reduction electrode on the signal line insulation layer and in at least a portion of an area other than an area having the plurality of first electrodes; and a second electrode on the plurality of first electrodes and spaced apart from the plurality of first electrodes; an encapsulation portion on the second electrode; and a plurality of touch electrodes on the encapsulation portion.

According to the embodiments of the present disclosure, it is possible to allow the noise generated in a signal line or a first electrode to be discharged through a noise reduction electrode by arranging the noise reduction electrode in the area where the first electrode is not arranged between a second electrode adjacent to a touch electrode and a signal line.

Accordingly, an increase in the noise of a touch-sensing signal due to the coupling of the noise with the touch electrode, which is coupled with the second electrode, can be mitigated by minimizing or reducing the noise of the second electrode, which is coupled by the signal line or the first electrode.

In addition, by applying the same voltage to the second electrode and the noise reduction electrode, an increase in the load due to the noise reduction electrode and the noise of the touch-sensing signal can be reduced, thereby improving the touch sensing performance.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
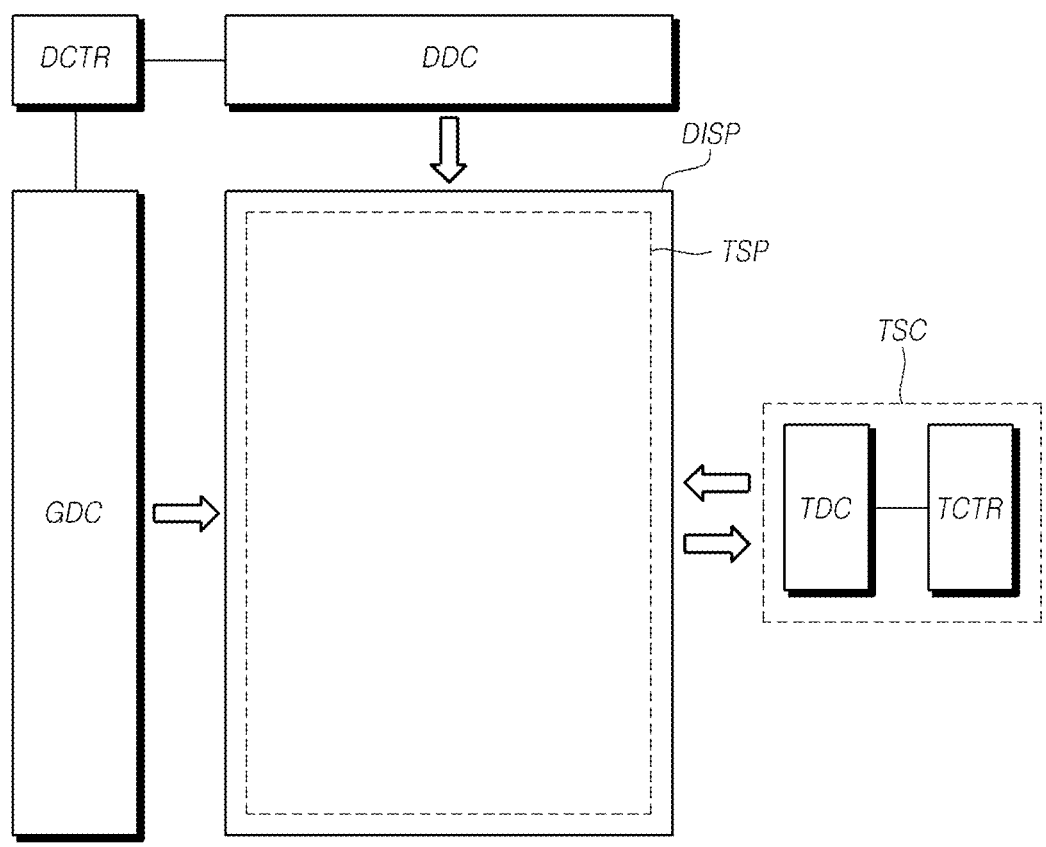
FIG. 1 is a view schematically illustrating the configuration of a touch display device according to embodiments of the present disclosure.

Hereinafter, embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b), or the like may be used herein when describing components of the present disclosure. These terms are merely used to distinguish one component from other components, and the property, order, sequence and the like of the corresponding component are not limited by the corresponding term. In the case that it is described that a certain structural element "is connected to," "is coupled to," or "is in contact with" another structural element, it should be interpreted that another structural element may "be connected to," "be coupled to," or "be in contact with" the structural elements as well as that the certain structural element is directly connected to or is in direct contact with another structural element.

FIG. 1 is a view illustrating the system configuration of a touch display device according to embodiments of the present disclosure.

With reference to FIG. 1, a touch display device according to embodiments of the present disclosure may provide both a function for displaying an image and a function for touch sensing. To provide an image display function, the touch display device according to embodiments of the present disclosure may include a display panel (DISP) on which a plurality of data lines and a plurality of gate lines are arranged and on which a plurality of subpixels defined by the plurality of data lines and the plurality of gate lines are arranged, a data-driving circuit (DDC) for driving the plurality of data lines, a gate-driving circuit (GDC) for driving the plurality of gate lines, and a display controller (DCTR) for controlling the operation of the data-driving circuit (DDC) and the gate-driving circuit (GDC).

Each of the data-driving circuit (DDC), the gate-driving circuit (GDC), and the display controller (DCTR) may be implemented as one or more discrete components. In some cases, two or more of the data-driving circuit (DDC), the gate-driving circuit (GDC), and the display controller (DCTR) may be integrated into a single component. For example, the data-driving circuit (DDC) and the display controller (DCTR) may be implemented as a single integrated circuit chip (IC Chip).

To provide a touch-sensing function, the touch display device according to embodiments of the present disclosure may include a touch panel (TSP) including a plurality of touch electrodes and a touch-sensing circuit (TSC) for supplying a touch-driving signal to the touch panel (TSP), detecting a touch-sensing signal from the touch panel (TSP), and sensing whether or not a user's touch is performed on the touch panel (TSP) or a touch position (touch coordinates) thereof on the basis of the detected touch-sensing signal. The touch-sensing circuit (TSC), for example, may include a touch-driving circuit (TDC) for supplying a touch-driving signal to the touch panel (TSP) and detecting a touch-sensing signal from the touch panel (TSP) and a touch controller (TCTR) for sensing whether or not a user's touch is performed on the touch panel (TSP) and/or a touch position thereof on the basis of the touch-sensing signal detected by the touch-driving circuit (TDC).

The touch-driving circuit (TDC) may include a first circuit part for supplying a touch-driving signal to the touch panel (TSP) and a second circuit part for detecting a touch-sensing signal from the touch panel (TSP). The touch-driving circuit (TDC) and the touch controller (TCTR) may be implemented as separate components, or in some cases, may be integrated into a single component.

Each of the data-driving circuit (DDC), the gate-driving circuit (GDC), and the touch-driving circuit (TDC) may be implemented as one or more integrated circuits and, in terms of electrical connection with the display panel (DISP), may be implemented as a chip-on-glass (COG) type, a chip-on-film (COF) type, a tape carrier package (TCP) type, or the like. The gate-driving circuit (GDC) may also be implemented as a gate-in-panel (GIP) type.

The respective circuit configurations (DDC, GDC, and DCTR) for display driving and the respective circuit configurations (TDC and TCTR) for touch sensing may be implemented as one or more discrete components. In some cases, one or more of the circuit configurations (DDC, GDC, and DCTR) for display driving and one or more of the circuit configurations (TDC and TCTR) for touch sensing may be functionally integrated into one or more components.

For example, the data-driving circuit (DDC) and the touch-driving circuit (TDC) may be integrated into one or more integrated circuit chips. In the case where the data-driving circuit (DDC) and the touch-driving circuit (TDC)

are integrated into two or more integrated circuit chips, the two or more integrated circuit chips may have a data driving function and a touch driving function, respectively.

The touch display device according to embodiments of the present disclosure may be any of various types of display devices such as an organic light-emitting display device, a liquid crystal display device, or the like. Hereinafter, for the convenience of explanation, a description will be made on the basis of an example in which the touch display device is an organic light-emitting display device. For example, although the display panel (DISP) may be any of various types of display panels, such as an organic light-emitting display panel, a liquid crystal display panel, or the like, the following description will be made on the basis of an example in which the display panel (DISP) is an organic light-emitting display panel for the convenience of explanation.

As will be described later, the touch panel (TSP) may include a plurality of touch electrodes, to which a touch-driving signal is applied or from which a touch-sensing signal is detected, and a plurality of touch-routing lines for connecting the plurality of touch electrodes to the touch-driving circuit (TDC).

The touch panel (TSP) may be provided outside the display panel (DISP). For example, the touch panel (TSP) and the display panel (DISP) may be separately manufactured and combined with each other. Such a touch panel (TSP) may be referred to as an "external type" or "add-on type" touch panel.

Alternatively, the touch panel (TSP) may be embedded in the display panel (DISP). For example, a touch sensor structure, such as a plurality of touch electrodes, a plurality of touch-routing lines, and the like, constituting the touch panel (TSP) may be formed together with electrodes and signal lines for driving the display when manufacturing the display panel (DISP). Such a touch panel (TSP) is called an "embedded-type touch panel." Hereinafter, for the convenience of explanation, the embedded-type touch panel (TSP) will be described by way of example.

Figure 2:
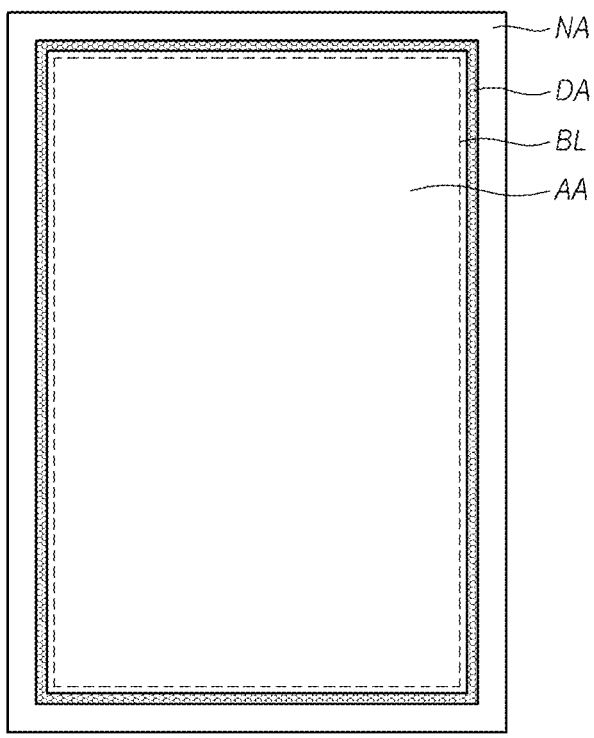
FIG. 2 is a view schematically illustrating a display panel of a touch display device according to embodiments of the present disclosure.

FIG. 2 is a view schematically illustrating a display panel (DISP) of a touch display device according to embodiments of the present disclosure.

With reference to FIG. 2, the display panel (DISP) may include an active area (AA) in which an image is displayed and a non-active area (NA), which is an outer area of an outer boundary line (BL) of the active area (AA). In the active area (AA) of the display panel (DISP), a plurality of subpixels for displaying images is arranged, and various electrodes and signal lines for driving the display are arranged.

In addition, a plurality of touch electrodes for touch sensing and a plurality of touch-routing lines electrically connected to the touch electrodes may be arranged in the active area (AA) of the display panel (DISP). Accordingly, the active area (AA) may be referred to as a "touch-sensing area" in which a touch is able to be sensed.

In the non-active area (NA) of the display panel (DISP), link lines, which are extensions of various signal lines arranged in the active area (AA), or link lines electrically connected to various signal lines arranged in the active area (AA) and pads electrically connected to the link lines may be arranged. The pads arranged in the non-active area (NA) may be bonded or electrically connected to the display driving circuits (DDC, GDC, or the like).

In addition, in the non-active area (NA) of the display panel (DISP), link lines, which are extensions of a plurality of touch-routing lines arranged in the active area (AA), or link lines electrically connected to the plurality of touch-routing lines arranged in the active area (AA) and pads electrically connected to the link lines may be arranged. The pads arranged in the non-active area (NA) may be bonded or electrically connected to the touch-driving circuit (TDC).

An extended portion of a part of the outermost touch electrode, among the plurality of touch electrodes arranged in the active area (AA), may be in the non-active area (NA), and one or more electrodes (touch electrodes) of the same material as the plurality of touch electrodes arranged in the active area (AA) may be further arranged in the non-active area (NA).

For example, all of the plurality of touch electrodes arranged in the display panel (DISP) may be provided in the active area (AA); some of the plurality of touch electrodes arranged in the display panel (DISP) (e.g., the outermost touch electrodes) may be provided in the non-active area (NA); or some of the plurality of touch electrodes arranged in the display panel (DISP) (e.g., the outermost touch electrodes) may be provided in both the active area (AA) and the non-active area (NA).

With reference to FIG. 2, the display panel (DISP) of a touch display device according to embodiments of the present disclosure may include a dam area (DA) where dams for preventing the collapse of a specific layer (e.g., an encapsulation portion in an organic light-emitting display panel) in the active area (AA) are arranged.

The dam area (DA) may be located at the boundary between the active area (AA) and the non-active area (NA) or at any place in the non-active area (NA) outside the active area (AA).

The dam may be arranged in the dam area (DA) to surround the active area (AA) in all directions, or may be arranged only in the outside of one or more portions of the active area (AA) (e.g., a portion thereof having a vulnerable layer).

The dam arranged in the dam area (DA) may have a single pattern that is continuous as a whole, or may have two or more discontinuous patterns. Further, only a primary dam may be arranged in the dam area (DA), or two dams (a primary dam and a secondary dam) or three or more dams may be arranged in the dam area (DA). In the dam area (DA), only a primary dam may be arranged in one direction, or both a primary dam and a secondary dam may be arranged in another direction.

Figure 3:
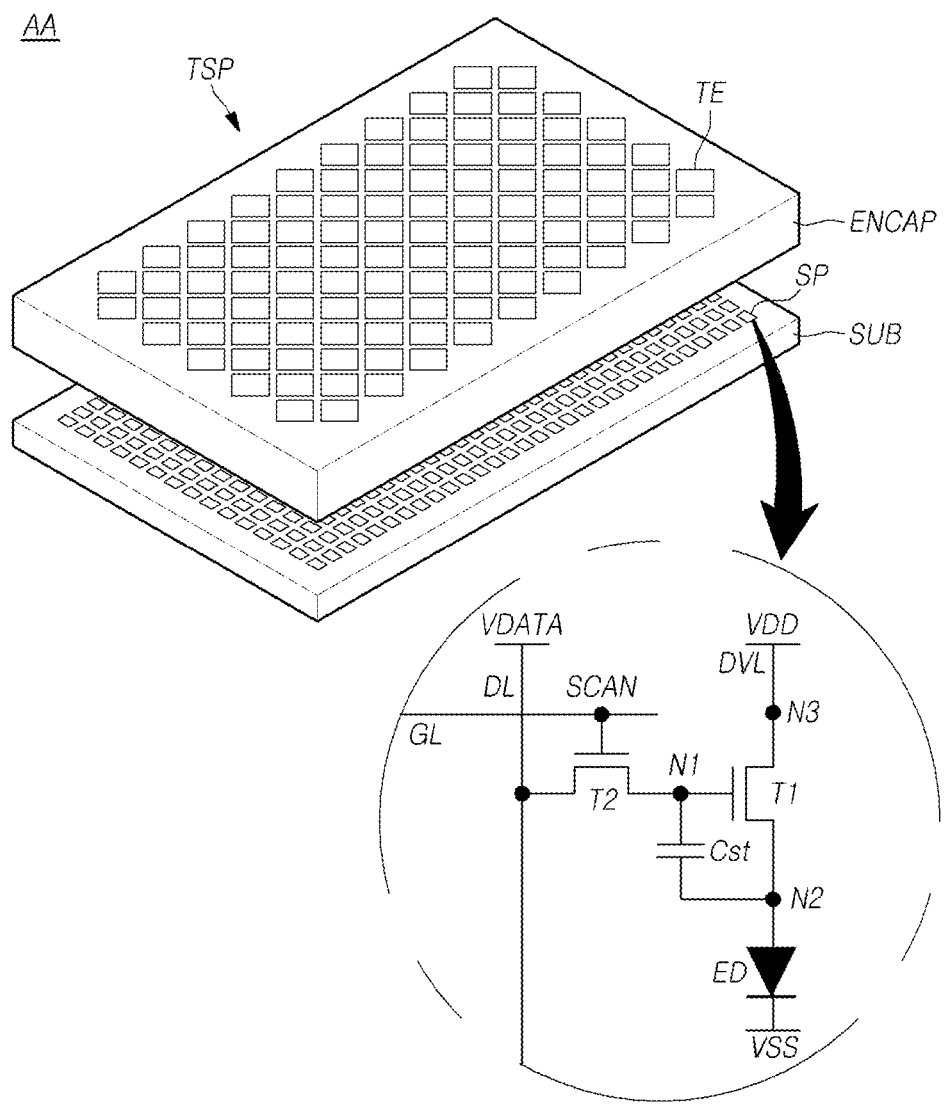
FIG. 3 is a view illustrating an example of a structure in which a touch panel is embedded in a display panel according to embodiments of the present disclosure.

FIG. 3 is a view illustrating an example of a structure in which a touch panel (TSP) is embedded in a display panel (DISP) according to embodiments of the present disclosure.

With reference to FIG. 3, a plurality of subpixels (SP) is arranged on a substrate (SUB) in the active area (AA) of the display panel (DISP). Each subpixel (SP) may include a light-emitting device (ED), a first transistor (T1) for driving the light-emitting device (ED), a second transistor (T2) for transmitting a data voltage (VDATA) to a first node (N1) of the first transistor (T1), and a storage capacitor (Cst) for maintaining a constant voltage for one frame.

The first transistor (T1) may include a first node (N1) to which a data voltage may be applied, a second node (N2) electrically connected to the light-emitting device (ED), and a third node (N3) to which a driving voltage (VDD) is applied from a driving voltage line (DVL). The first node (N1) may be a gate node; the second node (N2) may be a source node or a drain node; and the third node (N3) may be a drain node or a source node. The first transistor (T1) is also referred to as a "driving transistor" for driving the light-emitting device (ED).

The light-emitting device (ED) may include a first electrode (e.g., an anode electrode), a light-emitting layer, and a second electrode (e.g., a cathode electrode). The first electrode may be electrically connected to the second node (N2) of the first transistor (T1), and the second electrode may have a base voltage (VSS) applied thereto.

The light-emitting layer of the light-emitting device (ED) may be an organic light-emitting layer containing an organic material. In this case, the light-emitting device (ED) may be an organic light-emitting diode (OLED).

The second transistor (T2) may be controlled to be turned on and off by a scan signal (SCAN) applied through a gate line (GL), and may be electrically connected to the first node (N1) of the first transistor (T1) and the data line (DL), respectively. The second transistor (T2) may also be referred to as a "switching transistor." If the second transistor (T2) is turned on by the scan signal (SCAN), a data voltage (VDATA) supplied from the data line (DL) is transferred to the first node (N1) of the first transistor (T1). The storage capacitor (Cst) may be electrically connected both to the first node (N1) and to the second node (N2) of the first transistor (T1).

Each subpixel (SP), as shown in FIG. 3, may have a 2T1C structure including two transistors (T1 and T2) and one capacitor (Cst), and may further include one or more transistors, or may further include one or more capacitors in some cases. The storage capacitor (Cst) may be an external capacitor that is intentionally designed to be provided outside the first transistor (T1), instead of a parasitic capacitor (e.g., Cgs or Cgd), which is an internal capacitor to be provided between the first node (N1) and the second node (N2) of the first transistor (T1). Each of the first transistor (T1) and the second transistor (T2) may be an n-type transistor or a p-type transistor.

As described above, circuit devices, such as a light-emitting device (ED), two or more transistors (T1 and T2), and one or more capacitors (Cst), are arranged in the display panel (DISP). Because the circuit devices (in particular, the light-emitting device ED) are vulnerable to external moisture or oxygen, an encapsulation portion (ENCAP) for preventing or reducing the penetration of external moisture or oxygen into the circuit devices (in particular, the light-emitting device ED) may be arranged in the display panel (DISP).

The encapsulation portion (ENCAP) may be formed as a single layer or multiple layers.

The touch panel (TSP) may be formed on the encapsulation portion (ENCAP) in the touch display device according to embodiments of the present disclosure. For example, a touch sensor structure, such as a plurality of touch electrodes (TE) constituting the touch panel (TSP), may be arranged on the encapsulation portion (ENCAP) in the touch display device.

When sensing a touch, a touch-driving signal or a touch-sensing signal may be applied to the touch electrodes (TE). Therefore, when sensing a touch, a potential difference may be produced between the touch electrode (TE) and the cathode electrode arranged with the encapsulation portion (ENCAP) interposed therebetween, thereby incurring unnecessary parasitic capacitance. To reduce the parasitic capacitance, which may degrade touch sensitivity, the distance between the touch electrode (TE) and the cathode electrode may be designed to be equal to or greater than a predetermined value (e.g., 1 μm) in consideration of the panel thickness, panel-manufacturing processes, display performance, and the like. To this end, the thickness of the encapsulation portion (ENCAP), for example, may be designed to be at least 1 μm or more.

Figure 4:
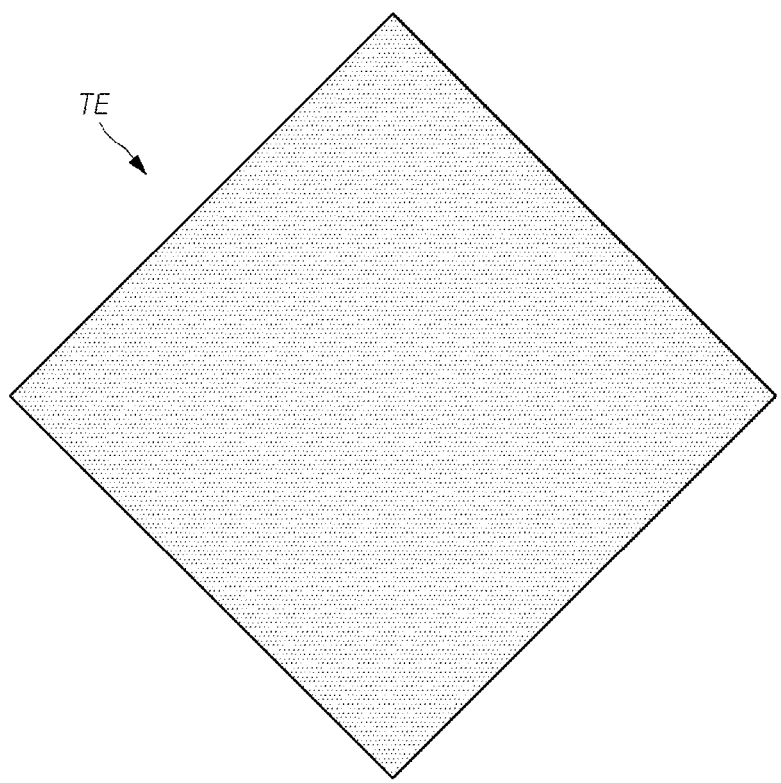
FIGS. 4 and 5 are views illustrating examples of the types of touch electrodes arranged in a display panel according to embodiments of the present disclosure.
Figure 5:
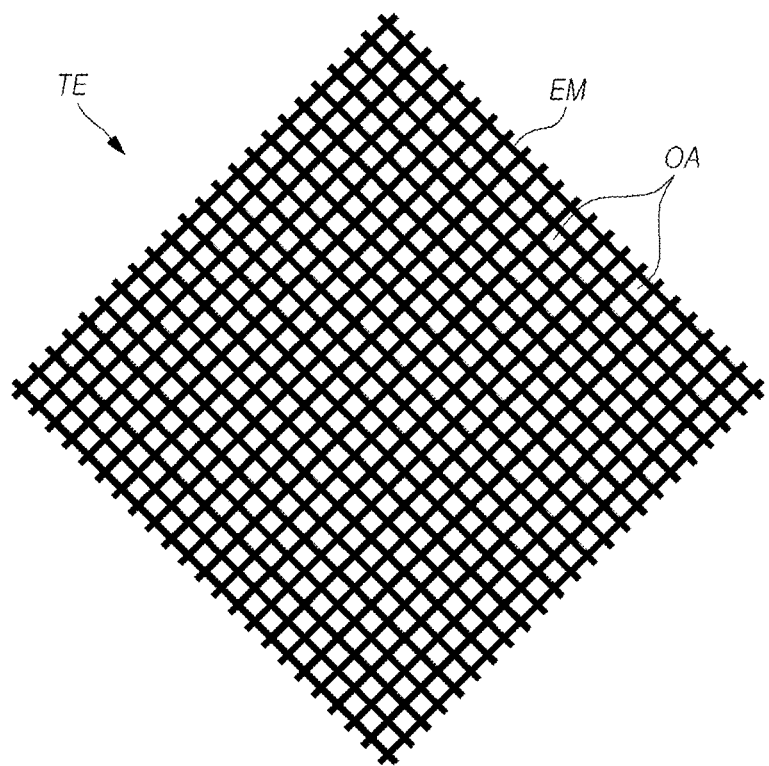

FIGS. 4 and 5 are views illustrating examples of the types of touch electrodes (TE) arranged in a display panel (DISP) according to embodiments of the present disclosure.

As shown in FIG. 4, each touch electrode (TE) arranged in the display panel (DISP) may be a plate-type electrode metal having no openings therein. In this case, each touch electrode (TE) may be a transparent electrode. For example, each touch electrode (TE) may be made of a transparent electrode material so that light emitted from a plurality of subpixels (SP) arranged thereunder can pass upwards through the touch electrode (TE).

Alternatively, as shown in FIG. 5, each touch electrode (TE) arranged in the display panel (DISP) may be an electrode metal (EM) patterned in the form of a mesh to have two or more openings (OA) therein. The electrode metal (EM) substantially corresponds to a touch electrode (TE) where a touch-driving signal is applied or a touch-sensing signal is detected.

As shown in FIG. 5, when each touch electrode (TE) is an electrode metal (EM) patterned in the form of a mesh, two or more openings (OA) may be provided in the area of the touch electrode (TE).

Each of the two or more openings (OA) provided in each touch electrode (TE) may correspond to the light-emitting area of one or more subpixels (SP). For example, a plurality of openings (OA) provides paths through which light emitted from a plurality of subpixels (SP) arranged thereunder passes. Hereinafter, a description will be made on the basis of an example in which each touch electrode (TE) is a mesh-type electrode metal (EM) for the convenience of explanation. The electrode metal (EM) corresponding to each touch electrode (TE) may be positioned on a bank that is arranged in the area other than the light-emitting area of two or more subpixels (SP).

As a method of providing a plurality of touch electrodes (TE), the electrode metal (EM) may be formed to be wide in the form of a mesh, and then the electrode metal (EM) may be cut into a predetermined pattern to electrically isolate the electrode metal (EM), thereby providing a plurality of touch electrodes (TE).

Figure 6:
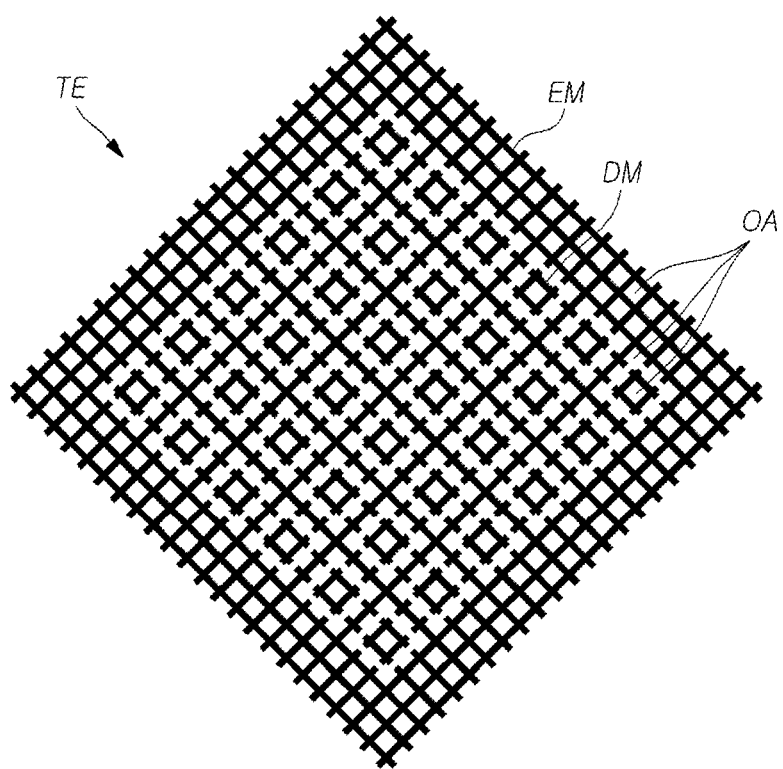
FIG. 6 is a view illustrating an example of the mesh-type touch electrode shown in FIG. 5.

The outline of the touch electrode (TE) may have a square shape, such as a diamond shape or a rhombus, as shown in FIGS. 4 and 5, or may have any of various shapes, such as a triangle, a pentagon, or a hexagon. FIG. 6 is a view illustrating an example of the mesh-type touch electrode (TE) shown in FIG. 5.

With reference to FIG. 6, the area of each touch electrode (TE) may be provided with one or more dummy metals (DM) that are separate from the mesh-type electrode metal (EM). The electrode metal (EM) substantially corresponds to a touch electrode (TE) where a touch-driving signal is applied or a touch-sensing signal is detected. However, although the dummy metal (DM) is provided in the area of the touch electrode (TE), a touch-driving signal is not applied thereto and a touch-sensing signal is not detected therefrom. For example, the dummy metal (DM) may be an electrically floating metal. Therefore, the electrode metal (EM) may be electrically connected to the touch-driving circuit (TDC), whereas the dummy metal (DM) may not be electrically connected to the touch-driving circuit (TDC).

One or more dummy metals (DM) may be provided in the areas of the respective touch electrodes (TE) in the state of being disconnected from the electrode metal (EM). Alternatively, one or more dummy metals (DM) may be provided only in the areas of some of all the touch electrodes (TE) in the state of being disconnected from the electrode metal (EM). For example, the dummy metal (DM) may not be provided in the areas of some touch electrodes (TE).

With regard to the role of the dummy metal (DM), in the case where no dummy metal (DM) is provided and only the mesh-type electrode metal (EM) is provided in the area of the touch electrode (TE), as shown in FIG. 5, there may be a visible defect in which the outline of the electrode metal (EM) may be visible on the screen. On the other hand, when one or more dummy metals (DM) are provided in the area of the touch electrode (TE) as shown in FIG. 6, it is possible to remove the visible defect in which the outline of the electrode metal (EM) may be visible on the screen. In addition, the magnitude of the capacitance for each touch electrode (TE) may be adjusted by providing or not providing the dummy metals (DM) or by adjusting the number of dummy metals (DM) (the ratio of dummy metals) for each touch electrode (TE), thereby enhancing touch sensitivity.

Some points of the electrode metal (EM) formed in the area of one touch electrode (TE) may be cut away so that the cut electrode metal (EM) becomes the dummy metal (DM). For example, the electrode metal (EM) and the dummy metal (DM) may be formed of the same material in the same layer.

The touch display device according to embodiments of the present disclosure may sense a touch on the basis of the capacitance produced in the touch electrode (TE). The touch display device according to embodiments of the present disclosure is able to sense a touch by a capacitance-based touch-sensing method, such as a mutual-capacitance-based touch-sensing method or a self-capacitance-based touch-sensing method.

In the case of the mutual-capacitance-based touch-sensing method, a plurality of touch electrodes (TE) may be divided into driving-touch electrodes (transmission touch electrodes or TX touch electrodes) to which a touch-driving signal is applied and sensing-touch electrodes (reception touch electrodes or RX touch electrodes), in which a touch-sensing signal is detected and which form capacitance together with the driving-touch electrodes.

In the case of the mutual-capacitance-based touch-sensing method, a touch-sensing circuit (TSC) senses whether or not a touch is performed and/or the touch coordinates on the basis of a change in the capacitance (mutual-capacitance) between the driving-touch electrode and the sensing-touch electrode depending on whether or not there is a pointer such as a finger or a pen.

In the case of the self-capacitance-based touch-sensing method, each touch electrode (TE) serves both as the driving-touch electrode and as the sensing-touch electrode. For example, the touch-sensing circuit (TSC) applies a touch-driving signal to one or more touch electrodes (TE), detects a touch-sensing signal through the touch electrodes (TE) to which the touch-driving signal is applied, and recognizes a change in the capacitance between a pointer, such as a finger or a pen, and the touch electrode (TE) on the basis of the detected touch-sensing signal, thereby sensing whether or not a touch is performed and/or the touch coordinates. The self-capacitance-based touch-sensing method does not distinguish between the driving-touch electrode and the sensing-touch electrode.

As described above, the touch display device according to embodiments of the present disclosure may sense a touch by a mutual-capacitance-based touch-sensing method or a self-capacitance-based touch-sensing method. Hereinafter, for the convenience of explanation, a description will be made on the basis of an example in which the touch display device performs mutual-capacitance-based touch-sensing and has a touch sensor structure for the same.

Figure 7:
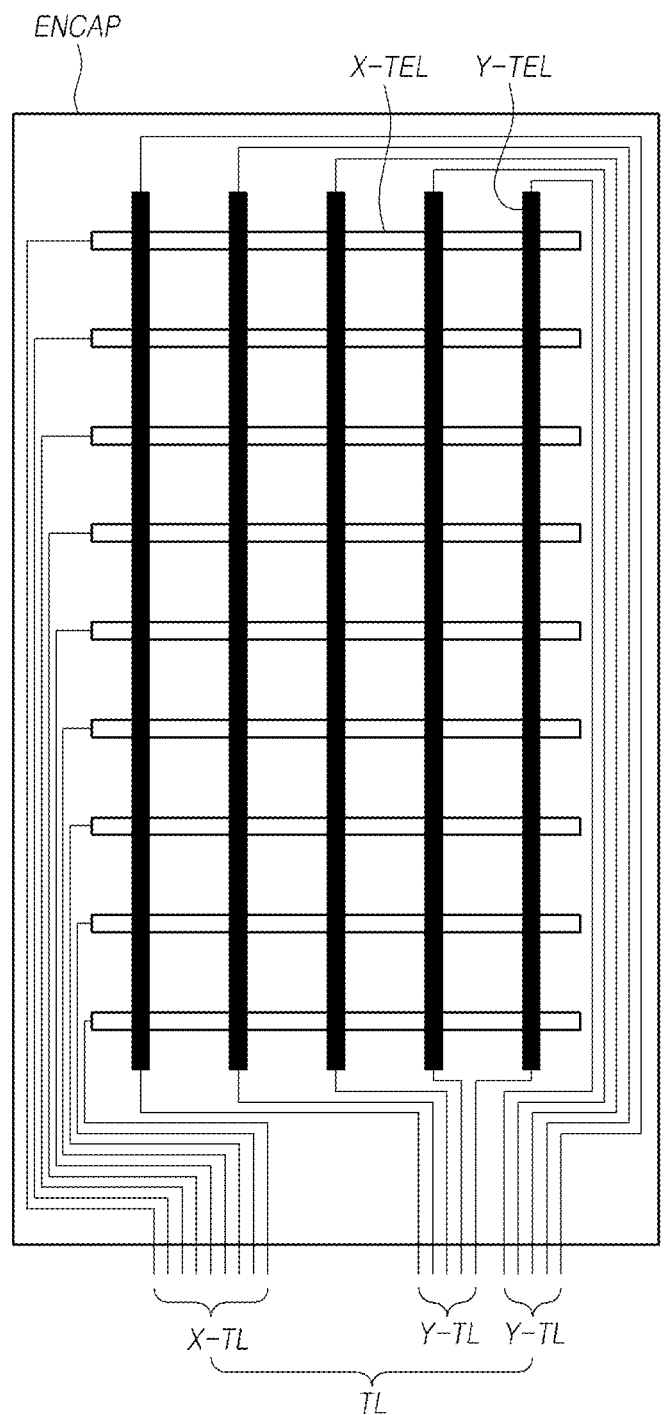
FIG. 7 is a view schematically illustrating a touch sensor structure in a display panel according to embodiments of the present disclosure.
Figure 8:
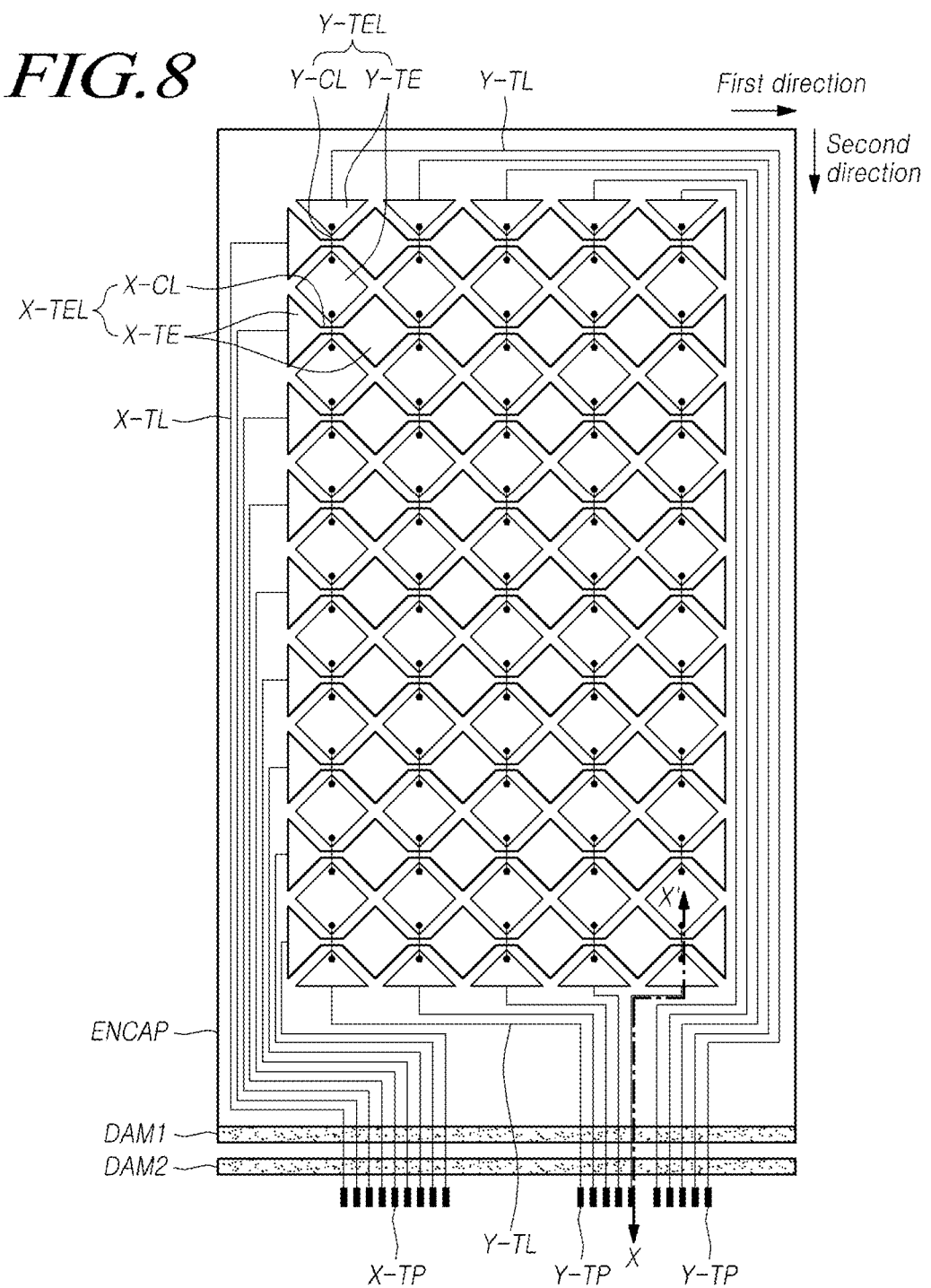
FIG. 8 is a view illustrating an example of implementation of the touch sensor structure shown in FIG. 7.

FIG. 7 is a view schematically illustrating a touch sensor structure in a display panel (DISP) according to embodiments of the present disclosure, and FIG. 8 is a view illustrating an example of implementation of the touch sensor structure in FIG. 7.

With reference to FIG. 7, a touch sensor structure for mutual-capacitance-based touch sensing may include a plurality of X-touch electrode lines (X-TEL) and a plurality of Y-touch electrode lines (Y-TEL). The plurality of X-touch electrode lines (X-TEL) and the plurality of Y-touch electrode lines (Y-TEL) may be positioned on the encapsulation portion (ENCAP). The respective X-touch electrode lines (X-TEL) may be arranged in a first direction, and the respective Y-touch electrode lines (Y-TEL) may be arranged in a second direction different from the first direction.

In the present specification, the first direction and the second direction may be different from each other, and for example, the first direction may be the x-axis direction and the second direction may be the y-axis direction. On the other hand, the first direction may be the y-axis direction and the second direction may be the x-axis direction. In addition, the first direction and the second direction may or may not be orthogonal to each other. In the present specification, rows and columns are relative, and may be interchanged with each other depending on the point of view.

Each of the plurality of X-touch electrode lines (X-TEL) may include a plurality of X-touch electrodes (X-TE) electrically connected to each other. Each of the plurality of Y-touch electrode lines (Y-TEL) may include a plurality of Y-touch electrodes (Y-TE) electrically connected to each other.

The plurality of X-touch electrodes (X-TE) and the plurality of Y-touch electrodes (Y-TE) belong to a plurality of touch electrodes (TE), and have different roles (functions) from each other.

For example, a plurality of X-touch electrodes (X-TE) constituting each of the plurality of X-touch electrode lines (X-TEL) may be driving-touch electrodes, and a plurality of Y-touch electrodes (Y-TE) constituting each of the plurality of Y-touch electrode lines (Y-TEL) may be sensing-touch electrodes. In this case, the respective X-touch electrode lines (X-TEL) correspond to driving-touch-electrode lines, and the respective Y-touch electrode lines (Y-TEL) correspond to sensing-touch electrode lines.

On the other hand, a plurality of X-touch electrodes (X-TE) constituting each of the plurality of X-touch electrode lines (X-TEL) may be sensing-touch electrodes, and a plurality of Y-touch electrodes (Y-TE) constituting each of the plurality of Y-touch electrode lines (Y-TEL) may be driving-touch electrodes. In this case, the respective X-touch electrode lines (X-TEL) correspond to sensing-touch electrode lines, and the respective Y-touch electrode lines (Y-TEL) correspond to driving-touch-electrode lines.

The touch sensor metal for touch sensing may include a plurality of touch-routing lines (TL), as well as the plurality of X-touch electrode lines (X-TEL) and the plurality of Y-touch electrode lines (Y-TEL). The plurality of touch-routing lines (TL) may include one or more X-touch-routing lines (X-TL) connected to the respective X-touch electrode lines (X-TEL) and one or more Y-touch-routing lines (Y-TL) connected to the respective Y-touch electrode lines (Y-TEL).

With reference to FIG. 8, each of the plurality of X-touch electrode lines (X-TEL) may include a plurality of X-touch electrodes (X-TE) arranged in the same row (or column) and one or more X-touch-electrode-connecting lines (X-CL) for electrically connecting the same to each other. The X-touch-electrode-connecting line (X-CL) for connecting two adjacent X-touch electrodes (X-TE) may be a metal that is integral with two adjacent X-touch electrodes (X-TE) (see FIG. 8), or may be a metal connected with two adjacent X-touch electrodes (X-TE) through contact holes.

Each of the plurality of Y-touch electrode lines (Y-TEL) may include a plurality of Y-touch electrodes (Y-TE) arranged in the same column (or row) and one or more Y-touch-electrode-connecting lines (Y-CL) for electrically connecting the same to each other. The Y-touch-electrode-connecting line (Y-CL) for connecting two adjacent Y-touch electrodes (Y-TE) may be a metal that is integral with two adjacent Y-touch electrodes (Y-TE), or may be a metal connected to two adjacent Y-touch electrodes (Y-TE) through contact holes (see FIG. 8).

The X-touch-electrode-connecting line (X-CL) and the Y-touch-electrode-connecting line (Y-CL) may intersect each other in the area (a touch-electrode-line intersection area) where the X-touch electrode line (X-TEL) and the Y-touch electrode line (Y-TEL) intersect each other.

In the case where the X-touch-electrode-connecting line (X-CL) and the Y-touch-electrode-connecting line (Y-CL) intersect in the touch-electrode-line intersection area as described above, the X-touch-electrode-connecting line (X-CL) and the Y-touch-electrode-connecting line (Y-CL) must be positioned in different layers from each other.

Accordingly, to achieve an arrangement such that the plurality of X-touch electrode lines (X-TEL) and the plurality of Y-touch electrode lines (Y-TEL) intersect each other, the plurality of X-touch electrodes (X-TE), the plurality of X-touch-electrode-connecting lines (X-CL), the plurality of Y-touch electrodes (Y-TE), the plurality of Y-touch electrode lines (Y-TEL), and the plurality of Y-touch-electrode-connecting lines (Y-CL) may be provided in two or more layers.

With reference to FIG. 8, the respective X-touch electrode lines (X-TEL) are electrically connected to corresponding X-touch pads (X-TP) via one or more X-touch-routing lines (X-TL). For example, the outermost X-touch electrode (X-TE), among the plurality of X-touch electrodes (X-TE) included in one X-touch electrode line (X-TEL), is electrically connected to the corresponding X-touch pad (X-TP) via the X-touch-routing line (X-TL).

The respective Y-touch electrode lines (Y-TEL) are electrically connected to corresponding Y-touch pads (Y-TP) via one or more Y-touch-routing lines (Y-TL). For example, the outermost Y-touch electrode (Y-TE), among the plurality of Y-touch electrodes (Y-TE) included in one Y-touch electrode line (Y-TEL), is electrically connected to the corresponding Y-touch pad (Y-TP) via the Y-touch-routing line (Y-TL).

As shown in FIG. 8, the plurality of X-touch electrode lines (X-TEL) and the plurality of Y-touch electrode lines (Y-TEL) may be arranged on the encapsulation portion (ENCAP). For example, the plurality of X-touch electrodes (X-TE) and the plurality of X-touch-electrode-connecting lines (X-CL) constituting the plurality of X-touch electrode lines (X-TEL) may be arranged on the encapsulation portion (ENCAP). The plurality of Y-touch electrodes (Y-TE) and the plurality of Y-touch-electrode-connecting lines (Y-CL) constituting the plurality of Y-touch electrode lines (Y-TEL) may be arranged on the encapsulation portion (ENCAP).

As shown in FIG. 8, the respective X-touch-routing lines (X-TL) electrically connected to the plurality of X-touch electrode lines (X-TEL) may be arranged on the encapsulation portion (ENCAP) to extend to the area where the encapsulation portion (ENCAP) is not provided, and may be electrically connected to a plurality of X-touch pads (X-TP). The respective Y-touch-routing lines (Y-TL) electrically connected to the plurality of Y-touch electrode lines (Y-TEL) may be arranged on the encapsulation portion (ENCAP) to extend to the area where the encapsulation portion (ENCAP) is not provided, and may be electrically connected to a plurality of Y-touch pads (Y-TP). The encapsulation portion (ENCAP) may be provided in the active area (AA), and in some cases may extend to the non-active area (NA).

As described above, a dam area (DA) may be provided in the boundary area between the active area (AA) and the non-active area (NA) or in the non-active area (NA) outside the active area (AA) in order to prevent any layer (e.g., an encapsulation portion in the organic light-emitting display panel) in the active area (AA) from collapsing.

As shown in FIG. 8, for example, a primary dam (DAM1) and a secondary dam (DAM2) may be arranged in the dam area (DA). The secondary dam (DAM2) may be positioned outside the primary dam (DAM1).

As alternatives to the example in FIG. 8, only the primary dam (DAM1) may be provided in the dam area (DA), and in some cases, one or more additional dams, as well as the primary dam (DAM1) and the secondary dam (DAM2), may be further arranged in the dam area (DA).

With reference to FIG. 8, the encapsulation portion (ENCAP) may be positioned on the side of the primary dam (DAM1), or the encapsulation portion (ENCAP) may be positioned on the top of the primary dam (DAM1), as well as on the side thereof.

Figure 9:
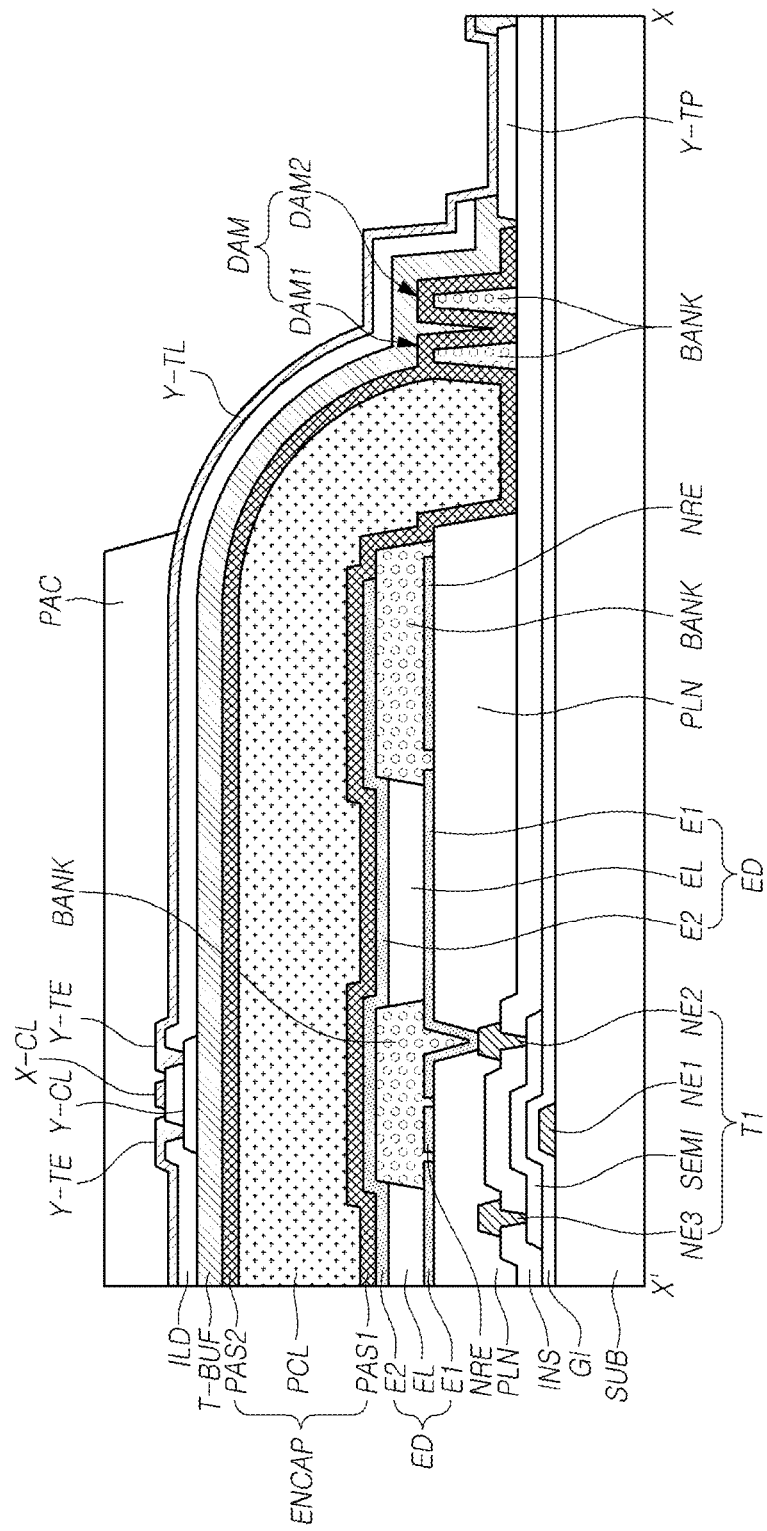
FIG. 9 is a cross-sectional view of a part of a display panel taken along line X-X' in FIG. 8 according to embodiments of the present disclosure.

FIG. 9 is a cross-sectional view of a part of a display panel (DISP) taken along line X-X' in FIG. 8 according to embodiments of the present disclosure. Although a plate-type touch electrode (TE) is illustrated in FIG. 9, this is merely an example, and a mesh-type touch electrode may be provided.

A first transistor (T1), which is a driving transistor in each subpixel (SP) in the active area (AA), is arranged on a substrate (SUB). The first transistor (T1) includes a first node electrode (NE1) serving as a gate electrode, a second node electrode (NE2) serving as a source electrode or a drain electrode, a third node electrode (NE3) serving as a drain electrode or a source electrode, a semiconductor layer (SEMI), and the like.

The first node electrode (NE1) and the semiconductor layer (SEMI) may overlap each other, with a gate insulation film (GI) interposed therebetween. The second node electrode (NE2) may be formed on an insulation layer (INS) to contact with one end of the semiconductor layer (SEMI), and the third node electrode (NE3) may be formed on the insulation layer (INS) to contact with the opposite end of the semiconductor layer (SEMI).

A light-emitting device (ED) may include a first electrode (E1) serving as an anode electrode (or a cathode electrode), a light-emitting layer (EL) formed on the first electrode (E1), and a second electrode (E2), which serves as a cathode electrode (or an anode electrode), formed on the light-emitting layer (EL). The first electrode (E1) is electrically connected to the second node electrode (NE2) of the first transistor (T1), which is exposed through a pixel contact hole passing through a planarization layer (PLN).

A noise reduction electrode (NRE) may be formed together with first electrode (E1). Here, the noise reduction electrode may be formed in areas where the first electrode (E1) is not formed. With the noise reduction electrode (NRE) may reduce noise on the touch electrode (TE) that is introduced by the second electrode (E2), as will be further described below with reference to FIGS. 13-19.

The light-emitting layer (EL) is formed on the first electrode (E1) in the light-emitting area provided by a bank (BANK). The light-emitting layer (EL) is formed by stacking layers in the order of a hole-related layer, a light-emitting layer, and an electron-related layer, or in the reverse order thereof, on the first electrode (E1). The second electrode (E2) is formed to face the first electrode (E1), with the light-emitting layer (EL) interposed therebetween.

The encapsulation portion (ENCAP) prevents or reduces external moisture or oxygen from penetrating into the light-emitting device (ED), which is vulnerable to external moisture or oxygen. The encapsulation portion (ENCAP) may be configured as a single layer, or may be configured as multiple layers (PAS1, PCL, and PAS2) as shown in FIG. 9.

For example, in the case where the encapsulation portion (ENCAP) is configured as multiple layers (PAS1, PCL, and PAS2), the encapsulation portion (ENCAP) may include one or more inorganic encapsulation layers (PAS1 and PAS2) and one or more organic encapsulation layers (PCL). For example, the encapsulation portion (ENCAP) may have a structure in which a first inorganic encapsulation layer (PAS1), an organic encapsulation layer (PCL), and a second inorganic encapsulation layer (PAS2) are sequentially stacked. The organic encapsulation layer (PCL) may further include at least one organic encapsulation layer or at least one inorganic encapsulation layer.

The first inorganic encapsulation layer (PAS1) is formed on the substrate (SUB), on which the second electrode (E2), serving as a cathode electrode, is formed to be closest to the light-emitting device (ED). The first inorganic encapsulation layer (PAS1) is formed of an inorganic insulation material that enables low-temperature deposition, such as silicon nitride ($SiN_x$), silicon oxide ($SiO_x$), silicon oxynitride (SiON), aluminum oxide ($Al_2O_3$), or the like. Because the first inorganic encapsulation layer (PAS1) is deposited in a low-temperature atmosphere, the first inorganic encapsulation layer (PAS1) is able to prevent the light-emitting layer (EL), which contains an organic material vulnerable to a high-temperature atmosphere, from being damaged during the deposition process.

The organic encapsulation layer (PCL) may be formed to have an area smaller than that of the first inorganic encapsulation layer (PAS1). In this case, the organic encapsulation layer (PCL) may be formed to expose both ends of the first inorganic encapsulation layer (PAS1). The organic encapsulation layer (PCL) may serve as a buffer for relieving the stress between the respective layers due to warping of the touch display device, which is an organic light-emitting display device, and may strengthen planarization performance. The organic encapsulation layer (PCL) may be formed of an organic insulation material such as an acrylic resin, an epoxy resin, polyimide, polyethylene, silicon oxycarbide (SiOC), or the like.

In the case where the organic encapsulation layer (PCL) is formed by an inkjet method, one or more dams (DAM) may be formed in the dam area (DA) corresponding to the boundary area between the non-active area (NA) and the active area (AA) or corresponding to some areas of the non-active area (NA).

For example, as shown in FIG. 9, the dam area (DA) is located between a pad area where a plurality of X-touch pads (X-TP) and a plurality of Y-touch pads (Y-TP) are formed in the non-active area (NA) and the active area (AA), and the dam area (DA) may be provided with a primary dam (DAM1) adjacent to the active area (AA) and a secondary dam (DAM2) adjacent to the pad area.

One or more dams (DAM) arranged in the dam area (DA) may prevent a liquid organic encapsulation layer (PCL) from collapsing toward the non-active area (NA) and infiltrating into the pad area when the liquid organic encapsulation layer (PCL) is dropped into the active area (AA). This effect can be further increased in the case where the primary dam (DAM1) and the secondary dam (DAM2) are provided, as shown in FIG. 9.

The primary dam (DAM1) and/or the secondary dam (DAM2) may be formed as a single-layered or a multi-layered structure. For example, the primary dam (DAM1) and/or the secondary dam (DAM2) may be formed of the same material and at the same time as at least one of the banks (BANK) and spacers (not shown). In this case, the dam structure may be formed without requiring an additional mask process and increasing costs.

In addition, the primary dam (DAM1) and the secondary dam (DAM2) may have a structure in which the first inorganic encapsulation layer (PAS1) and/or the second inorganic encapsulation layer (PAS2) are stacked on the banks (BANK), as shown in FIG. 9. In addition, the organic encapsulation layer (PCL) containing an organic material may be positioned only inside the primary dam (DAM1), as shown in FIG. 9. Alternatively, the organic encapsulation layer (PCL) containing an organic material may also be positioned on the top of at least a part of the primary dam (DAM1) and the secondary dam (DAM2). For example, the organic encapsulation layer (PCL) may also be positioned on the top of the primary dam (DAM1).

The second inorganic encapsulation layer (PAS2) may be formed to cover the top surface and the side surface of each of the organic encapsulation layer (PCL) and the first inorganic encapsulation layer (PAS1) on the substrate (SUB) on which the organic encapsulation layer (PCL) is formed. The second inorganic encapsulation layer (PAS2) reduces or prevents external moisture or oxygen from penetrating into the first inorganic encapsulation layer (PAS1) and the organic encapsulation layer (PCL). The second inorganic encapsulation layer (PAS2) is formed of an inorganic insulation material such as silicon nitride ($SiN_x$), silicon oxide ($SiO_x$), silicon oxynitride (SiON), aluminum oxide ($Al_2O_3$), or the like.

A touch buffer film (T-BUF) may be arranged on the encapsulation portion (ENCAP). The touch buffer film (T-BUF) may be provided between the touch sensor metal, which includes X- and Y-touch electrodes (X-TE and Y-TE) and X- and Y-touch-electrode-connecting lines (X-CL and Y-CL), and the second electrode (E2) of the light-emitting device (ED). The touch buffer film (T-BUF) may be designed to maintain the distance between the touch sensor metal and the second electrode (E2) of the light-emitting device (ED) at a predetermined minimum separation value (e.g., μm). Accordingly, it is possible to reduce or prevent the parasitic capacitance generated between the touch sensor metal and the second electrode (E2) of the light-emitting device (ED), thereby preventing deterioration of touch sensitivity due to the parasitic capacitance.

The touch sensor metal including the X- and Y-touch electrodes (X-TE and Y-TE) and the X- and Y-touch-electrode-connecting lines (X-CL and Y-CL) may be arranged on the encapsulation portion (ENCAP) without the touch buffer film (T-BUF).

In addition, the touch buffer film (T-BUF) may prevent chemical solutions (a developer, etchant, or the like), used in the process of manufacturing the touch sensor metal arranged on the touch buffer film (T-BUF), or external moisture from penetrating into the light-emitting layer (EL), which includes organic materials. Accordingly, the touch buffer film (T-BUF) is able to prevent damage to the light-emitting layer (EL), which is vulnerable to chemical solutions or moisture.

The touch buffer film (T-BUF) is formed of an organic insulation material, which is able to be formed at a low temperature below a predetermined temperature (e.g., 100 degrees C.) and has a low permittivity of 1 to 3, to prevent damage to the light-emitting layer (EL), which includes an organic material vulnerable to high temperatures. For example, the touch buffer film (T-BUF) may be formed of an acrylic-based, epoxy-based, or siloxane-based material. The touch buffer film (T-BUF), which is made of an organic insulation material to have a planarization property, may prevent damage to the respective encapsulation layers (PAS1, PCL, and PAS2) constituting the encapsulation portion (ENCAP) and the breakage of the touch sensor metal formed on the touch buffer film (T-BUF) due to warping of the organic light-emitting display device.

According to a mutual-capacitance-based touch sensor structure, the X-touch electrode lines (X-TEL) and the Y-touch electrode lines (Y-TEL) may be arranged to intersect each other on the touch buffer film (T-BUF). The Y-touch electrode line (Y-TEL) may include a plurality of Y-touch electrodes (Y-TE) and a plurality of Y-touch-electrode-connecting lines (Y-CL) for electrically connecting the plurality of Y-touch electrodes (Y-TE) to each other.

As shown in FIG. 9, the plurality of Y-touch electrodes (Y-TE) and the plurality of Y-touch-electrode-connecting lines (Y-CL) may be provided in different layers, with a touch insulation film (ILD) interposed therebetween.

The plurality of Y-touch electrodes (Y-TE) may be spaced a predetermined distance apart from each other in the y-axis direction. Each of the plurality of Y-touch electrodes (Y-TE) may be electrically connected to another Y-touch electrode (Y-TE) adjacent thereto in the y-axis direction by means of the Y-touch-electrode-connecting line (Y-CL).

The Y-touch-electrode-connecting line (Y-CL) may be formed on the touch buffer film (T-BUF) to be exposed through a touch contact hole passing through the touch insulation film (ILD), and may be electrically connected to two Y-touch electrodes (Y-TE), which are adjacent to each other in the y-axis direction. The Y-touch-electrode-connecting line (Y-CL) may be arranged to overlap the bank (BANK). Accordingly, it is possible to prevent the aperture ratio from being lowered due to the Y-touch-electrode-connecting line (Y-CL).

The X-touch electrode line (X-TEL) may include a plurality of X-touch electrodes (X-TE) and a plurality of X-touch-electrode-connecting lines (X-CL) for electrically connecting the plurality of X-touch electrodes (X-TE) to each other. The plurality of X-touch electrodes (X-TE) and the plurality of X-touch-electrode-connecting lines (X-CL) may be provided in different layers, with the touch insulation film (ILD) interposed therebetween.

The plurality of X-touch electrodes (X-TE) may be spaced a predetermined distance apart from each other in the x-axis direction on the touch insulation film (ILD). Each of the plurality of X-touch electrodes (X-TE) may be electrically connected to another X-touch electrode (X-TE) adjacent thereto in the x-axis direction through the X-touch-electrode-connecting line (X-CL).

The X-touch-electrode-connecting line (X-CL) may be arranged in the same plane as the X-touch electrodes (X-TE), and may be electrically connected to two X-touch electrodes (X-TE), which are adjacent to each other in the x-axis direction, without separate contact holes, or may be formed integrally with two X-touch electrodes (X-TE), which are adjacent to each other in the x-axis direction.

The X-touch-electrode-connecting line (X-CL) may be arranged to overlap the bank (BANK). Accordingly, a decrease of the aperture ratio due to the X-touch-electrode-connecting line (X-CL) can be prevented or reduced.

The Y-touch electrode line (Y-TEL) may be electrically connected to the touch-driving circuit (TDC) via the Y-touch-routing line (Y-TL) and the Y-touch pad (Y-TP). Similarly, the X-touch electrode line (X-TEL) may be electrically connected to the touch-driving circuit (TDC) via the X-touch-routing line (X-TL) and the X-touch pad (X-TP).

A pad cover electrode covering the X-touch pad (X-TP) and the Y-touch pad (Y-TP) may be further arranged. The X-touch pad (X-TP) may be formed separately from the X-touch-routing line (X-TL), or may be formed by extending the X-touch-routing line (X-TL). The Y-touch pad (Y-TP) may be formed separately from the Y-touch-routing line (Y-TL), or may be formed by extending the Y-touch-routing line (Y-TL).

In the case where the X-touch pad (X-TP) is formed by extending the X-touch-routing line (X-TL) and the Y-touch pad (Y-TP) is formed by extending the Y-touch-routing line (Y-TL), the X-touch pad (X-TP), the X-touch-routing line (X-TL), the Y-touch pad (Y-TP), and the Y-touch-routing line (Y-TL) may be formed of the same first conductive material. The first conductive material may be formed in a single-layered or multi-layered structure using a metal, such as Al, Ti, Cu, or Mo, which exhibits high corrosion resistance, high acid resistance, and high conductivity.

For example, the X-touch pad (X-TP), the X-touch-routing line (X-TL), the Y-touch pad (Y-TP), and the Y-touch-routing line (Y-TL), made of the first conductive material, may be formed in a three-layered structure such as Ti/Al/Ti or Mo/Al/Mo.

The pad cover electrode capable of covering the X-touch pad (X-TP) and the Y-touch pad (Y-TP) may be made of a second conductive material that is the same as the X- and Y-touch electrodes (X-TE and Y-TE). The second conductive material may be a transparent conductive material, such as ITO or IZO, which exhibits high corrosion resistance and high acid resistance. The pad cover electrode may be formed to be exposed by the touch buffer film (T-BUF), so that the pad cover electrode may be bonded to the touch-driving circuit (TDC) or may be bonded to a circuit film on which the touch-driving circuit (TDC) is mounted.

The touch buffer film (T-BUF) may be formed to cover the touch sensor metal, thereby preventing the touch sensor metal from being corroded by external moisture or the like. For example, the touch buffer film (T-BUF) may be formed of an organic insulation material, or may be formed in the form of a circular polarizer or a film of an epoxy or acrylic material. The touch buffer film (T-BUF) may not be provided on the encapsulation portion (ENCAP). For example, the touch buffer film (T-BUF) may not be an essential element.

The Y-touch-routing line (Y-TL) may be electrically connected to the Y-touch electrodes (Y-TE) through touch-routing-line contact holes, or may be integral with the Y-touch electrode (Y-TE). The Y-touch-routing line (Y-TL) may extend to the non-active area (NA), and may pass over the top and side of the encapsulation portion (ENCAP) and the top and side of the dam (DAM) to be electrically connected to the Y-touch pad (Y-TP). Accordingly, the Y-touch-routing line (Y-TL) may be electrically connected to the touch-driving circuit (TDC) via the Y-touch pad (Y-TP).

The Y-touch-routing line (Y-TL) may transmit a touch-sensing signal from the Y-touch electrode (Y-TE) to the touch-driving circuit (TDC), or may receive a touch-driving signal from the touch-driving circuit (TDC) to thus transfer the same to the Y-touch electrode (Y-TE).

The X-touch-routing line (X-TL) may be electrically connected to the X-touch electrodes (X-TE) through touch-routing-line contact holes, or may be integral with the X-touch electrode (X-TE).

The X-touch-routing line (X-TL) may extend to the non-active area (NA), and may pass over the top and side of the encapsulation portion (ENCAP) and the top and side of the dam (DAM) to be electrically connected to the X-touch pad (X-TP). Accordingly, the X-touch-routing line (X-TL) may be electrically connected to the touch-driving circuit (TDC) via the X-touch pad (X-TP).

The X-touch-routing line (X-TL) may receive a touch-driving signal from the touch-driving circuit (TDC) to thus transfer the same to the X-touch electrode (X-TE), or may transfer a touch-sensing signal from the X-touch electrode (X-TE) to the touch-driving circuit (TDC). The layout of the X-touch-routing lines (X-TL) and the Y-touch-routing lines (Y-TL) may be variously modified depending on the panel design.

A touch protection film (PAC) may be arranged on the X-touch electrode (X-TE) and the Y-touch electrode (Y-TE). The touch protection film (PAC) may be extended to the front or back of the dam (DAM) to be arranged on the X-touch-routing line (X-TL) and the Y-touch-routing line (Y-TL).

The cross-sectional view of FIG. 9 shows a conceptual structure, and thus the positions, thicknesses, or widths of the respective patterns (respective layers or respective electrodes) may vary depending on the viewing directions or positions; connection structures of the respective patterns may vary; other layers may be further provided in addition to the illustrated layers; and some of the illustrated layers may be omitted or integrated. For example, the width of the bank (BANK) may be smaller than that illustrated in the drawing, and the height of the dam (DAM) may be less than or greater than that illustrated in the drawing.

Figure 10:
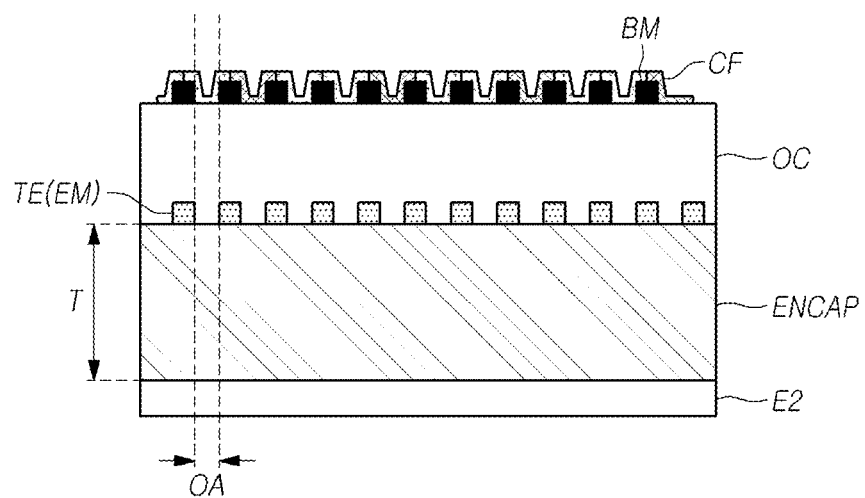
FIGS. 10 and 11 are views illustrating examples of a cross-sectional structure of a display panel including a color filter according to embodiments of the present disclosure.
Figure 11:
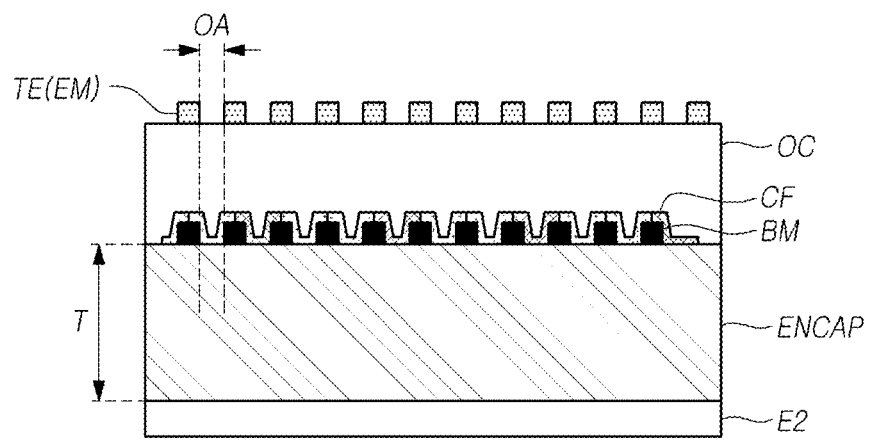

FIGS. 10 and 11 are views illustrating examples of the cross-sectional structure of a display panel (DISP) including a color filter (CF) according to embodiments of the present disclosure.

With reference to FIGS. 10 and 11, in the case where the touch panel (TSP) is embedded in the display panel (DISP) and the display panel (DISP) is implemented as an organic light-emitting display panel, the touch panel (TSP) may be positioned on the encapsulation portion (ENCAP) in the display panel (DISP). In other words, the touch sensor metal, such as a plurality of touch electrodes (TE), a plurality of touch-routing lines (TL), and the like, may be positioned on the encapsulation portion (ENCAP) in the display panel (DISP).

As described above, because the touch electrodes (TE) are provided on the encapsulation portion (ENCAP), the touch electrodes (TE) can be formed without significantly affecting the display performance and display-related layer formation.

With reference to FIGS. 10 and 11, a second electrode (E2), which may be a cathode electrode of an organic light-emitting diode (OLED), may be provided below the encapsulation portion (ENCAP).

The thickness (T) of the encapsulation portion (ENCAP) may be, for example, 1 micrometer or more.

As described above, it is possible to reduce the parasitic capacitance generated between the second electrode (E2) and the touch electrodes (TE) of the organic light-emitting diode (OLED) by designing the encapsulation portion (ENCAP) to have a thickness of 1 micrometer or more. Thus, it is possible to prevent deterioration in touch sensitivity due to parasitic capacitance.

As described above, each of the plurality of touch electrodes (TE) may be patterned in the form of a mesh in which the electrode metal (EM) has two or more openings (OA), and each of the two or more openings (OA) may correspond to one or more subpixels or the light-emitting area thereof in the vertical direction.

As described above, the electrode metal (EM) of the touch electrode (TE) may be patterned such that the light-emitting area of one or more subpixels is located to correspond to the position of each of two or more openings (OA) provided in the area of the touch electrode (TE) in a plan view, thereby increasing the luminous efficiency of the display panel (DISP).

As shown in FIGS. 10 and 11, a black matrix (BM) may be arranged on the display panel (DISP), and a color filter (CF) may be further arranged thereon.

The position of the black matrix (BM) may correspond to the position of the electrode metal (EM) of the touch electrode (TE). The positions of a plurality of color filters (CF) correspond to the positions of a plurality of touch electrodes (TE) or electrode metals (EM) constituting the plurality of touch electrodes (TE).

As described above, because the plurality of color filters (CF) is provided at positions corresponding to the positions of a plurality of openings (OA), it is possible to improve the luminous performance of the display panel (DISP). The vertical positional relationship between the plurality of color filters (CF) and the plurality of touch electrodes (TE) will be described below.

As shown in FIG. 10, the plurality of color filters (CF) and black matrixes (BM) may be provided on the plurality of touch electrodes (TE). In this case, the plurality of color filters (CF) and black matrixes (BM) may be positioned on an overcoat layer (OC) arranged on the plurality of touch electrodes (TE). The overcoat layer (OC) may or may not be the same layer as the touch protection film (PAC) shown in FIG. 9.

As shown in FIG. 11, the plurality of color filters (CF) and black matrixes (BM) may be provided under the plurality of touch electrodes (TE). In this case, the plurality of touch electrodes (TE) may be positioned on the overcoat layer (OC) on the plurality of color filters (CF) and black matrixes (BM). The overcoat layer (OC) may or may not be the same layer as the touch buffer film (T-BUF) or the touch insulation film (ILD) in FIG. 9.

Although a display panel (DISP) capable of sensing a touch can be easily realized by arranging the touch electrodes (TE) on the encapsulation portion (ENCAP), noise due to the display electrodes positioned under the encapsulation portion (ENCAP) may affect the touch sensing. In particular, as the thickness of the display panel (DISP) decreases, the distance between the touch electrode (TE) and the display electrode becomes closer, so that parasitic capacitance therebetween may increase and the noise of a touch-sensing signal may increase. In addition, noise due to signal lines or electrodes positioned below the display electrode may act as noise through the display electrode adjacent to the touch electrode (TE).

Figure 12:
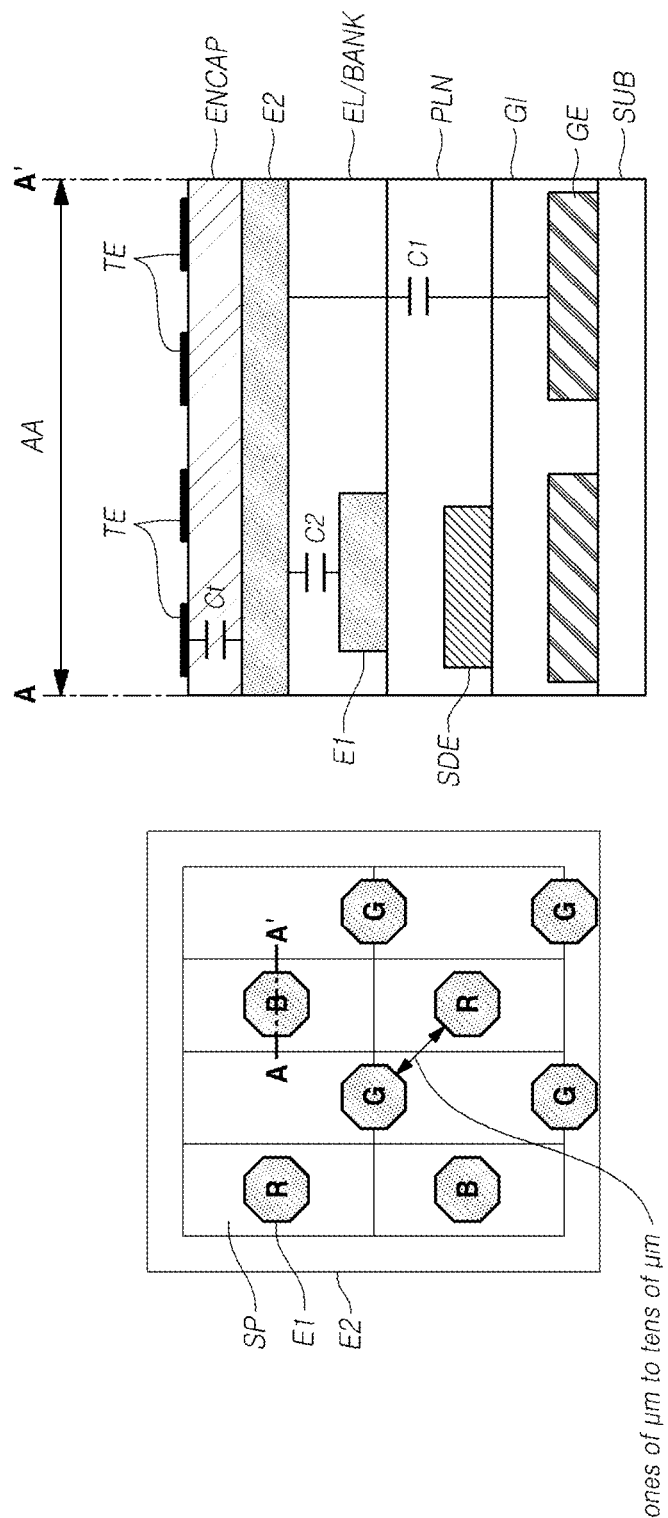
FIG. 12 is a view illustrating an example of arrangement of a touch electrode and a display electrode in an active area of a display panel according to embodiments of the present disclosure.

FIG. 12 is a view illustrating an example of arrangement of a touch electrode (TE) and a display electrode in an active area (AA) of a display panel (DISP) according to embodiments of the present disclosure.

With reference to FIG. 12, a plurality of first electrodes (E1) constituting respective subpixels (SP) may be arranged through partial deposition in the active area (AA) of the display panel (DISP). In addition, a second electrode (E2) may be deposited over the entire active area (AA).

Further, electrodes constituting signal lines for display driving may be arranged under the first electrode (E1), and touch electrodes (TE) for touch sensing may be arranged on the second electrode (E2). For example, a gate electrode (GE) is arranged on the substrate (SUB), and a gate insulation layer (GI) is arranged on the gate electrode (GE). The gate electrode (GE) may constitute a gate node of a transistor for driving each subpixel (SP), or may constitute a signal line.

A source/drain electrode (SDE) may be arranged on the gate insulation layer (GI), and a planarization film (PLN) may be arranged on the source/drain electrode (SDE). The source/drain electrode (SDE) may constitute a source electrode or a drain electrode of a transistor for driving each subpixel (SP), or may constitute a signal line.

In an example in which the gate electrode (GE) is used as a signal line, when various kinds of signals (e.g., a synchronization signal, a clock signal, etc.) are applied to the gate electrode (GE), capacitance (C1) may be produced between the gate electrode (GE) and the second electrode (E2). Therefore, a signal applied through the gate electrode (GE) may be coupled to the second electrode (E2), thereby acting as noise.

In addition, capacitance (C2) may be produced between the first electrode (E1), to which a voltage is applied through the signal line, and the second electrode (E2), so that noise may occur in the second electrode (E2) due to the coupling with a signal applied to the first electrode (E1).

As described above, because noise due to signal lines and electrodes positioned under the second electrode (E2) may be coupled to the second electrode (E2), and because capacitance (Ct) may be produced between the second electrode (E2) and the touch electrode (TE), the noise coupled to the second electrode (E2) may act as noise with respect to the touch electrodes (TE) above the second electrode (E2).

Embodiments of the present disclosure provide a method of preventing an increase in the noise of the touch electrode (TE) by reducing the noise of the second electrode (E2), which is coupled by the signal lines and the electrodes positioned under the second electrode (E2).

Figure 13:
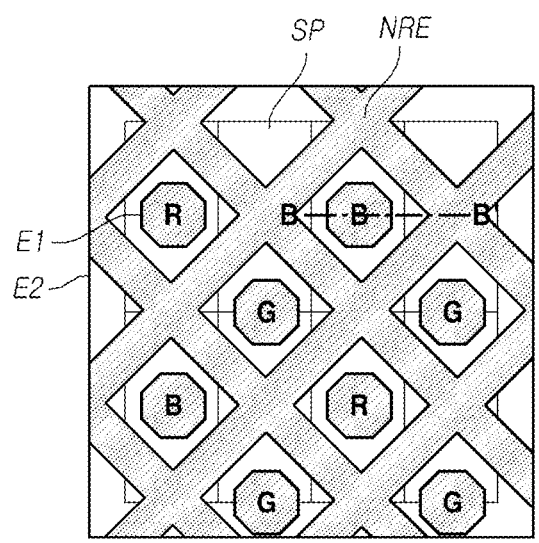
FIG. 13 is a view illustrating an example of a planar structure in which a noise reduction electrode is arranged in an active area of a display panel according to embodiments of the present disclosure.

FIG. 13 is a view illustrating an example of a planar structure of an active area (AA) of a display panel (DISP) according to embodiments of the present disclosure, and more specifically, an example in which a noise reduction electrode (NRE) for reducing noise coupled to the second electrode (E2) is arranged.

With reference to FIG. 13, a first electrode (E1) is arranged through partial deposition on the active area (AA) of the display panel (DISP), and a second electrode (E2) is deposited on the entire area thereof. In addition, a noise reduction electrode (NRE) may be arranged in the area where the first electrode (E1) is not provided, in the layer in which the first electrode (E1) is arranged.

The noise reduction electrode (NRE) may be formed of the same material as the first electrode (E1), and may be arranged to be separate from the first electrode (E1). In addition, the noise reduction electrode (NRE) may be integrally formed as a whole, as shown in the example of FIG. 13, or a plurality of noise reduction electrodes (NRE) may be arranged to be separated from each other. For example, the arrangement of the noise reduction electrode (NRE) is not limited to a specific pattern, and the noise reduction electrode (NRE) may be arranged between the second electrode (E2) and the gate electrode (GE) or the source/drain electrode (SDE) constituting the signal line.

Further, the noise reduction electrode (NRE) may be arranged in at least a portion of the area where the first electrode (E1) is not provided, in the layer in which the first electrode (E1) is arranged, so that no separate process is required in order to arrange the noise reduction electrode (NRE). A constant voltage may be applied to the noise reduction electrode (NRE). Because a constant voltage is applied to the noise reduction electrode (NRE), it is possible to reduce the noise coupled to the second electrode (E2).

Figure 14:
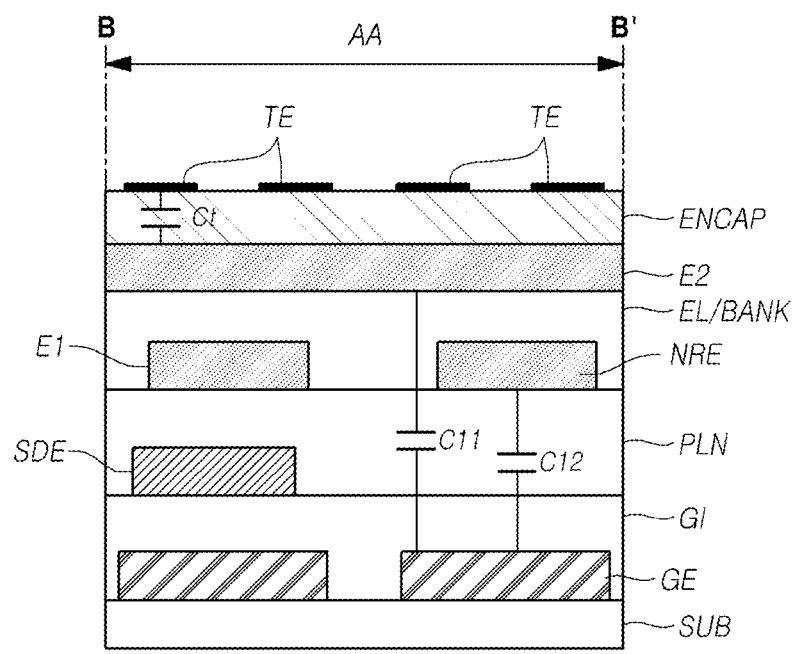
FIGS. 14 to 16 are views illustrating examples of a cross-sectional structure taken along the line B-B' in FIG. 13.
Figure 15:
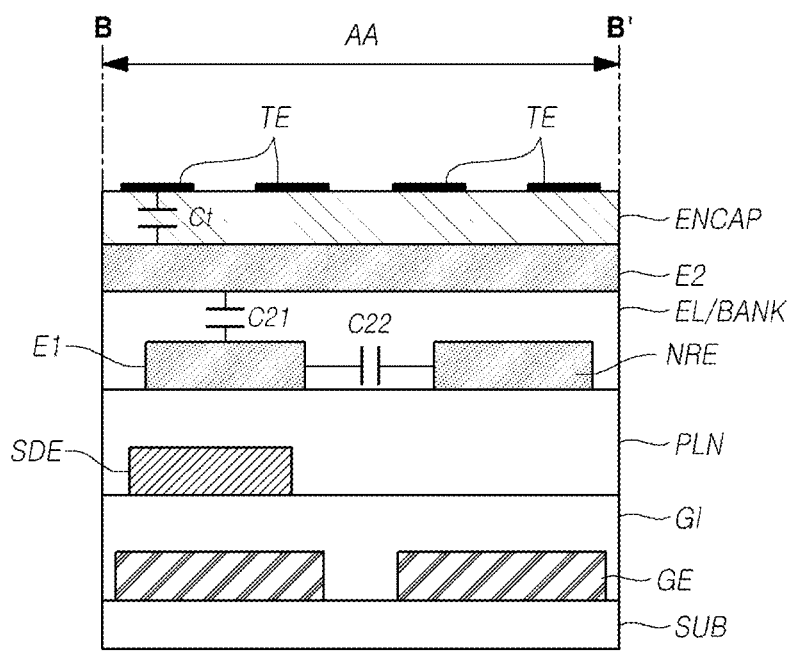
Figure 16:
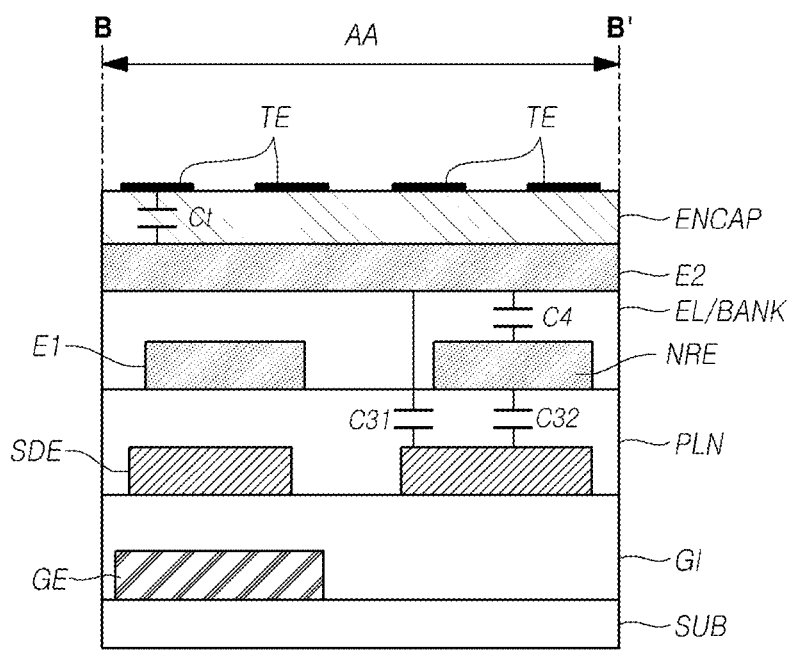

FIGS. 14 to 16 are views illustrating examples of a cross-sectional structure taken along line B-B' in FIG. 13, and more specifically, examples of arrangement of the noise reduction electrode (NRE) and reduction in the noise of the second electrode (E2) according thereto.

With reference to FIG. 14, in a display panel (DISP) according to embodiments of the present disclosure, a gate electrode (GE) is arranged on a substrate (SUB), and a gate insulation layer (GI) is arranged on the gate electrode (GE). In addition, the gate electrode (GE) may constitute a signal line to which various signals for display driving are applied.

A source/drain electrode (SDE) and a planarization film (PLN) may be arranged on the gate insulation layer (GI), and a first electrode (E1) may be arranged on the planarization film (PLN). In addition, a noise reduction electrode (NRE) may be arranged in at least a portion of the area where the first electrode (E1) is not provided on the planarization film (PLN). The noise reduction electrode (NRE) may be formed of the same material as the first electrode (E1), and may be arranged to be separate from the first electrode (E1).

A second electrode (E2) may be positioned on the first electrode (E1) and the noise reduction electrode (NRE), and an encapsulation portion (ENCAP) and touch electrodes (TE) may be arranged on the second electrode (E2). A light-emitting layer (EL), a bank (BANK), and the like may be arranged between the first electrode (E1) and the second electrode (E2).

Because the noise reduction electrode (NRE) is arranged between the gate electrode (GE), constituting the signal line, and the second electrode (E2), capacitance (C12) may be produced between the gate electrode (GE) and the noise reduction electrode (NRE).

Further, capacitance (C11) may be produced between the gate electrode (GE) and the second electrode (E2). Because the capacitance (C11) is produced between the gate electrode (GE) and the second electrode (E2), and because the capacitance (C12) is produced between the gate electrode (GE) and the noise reduction electrode (NRE), the degree of coupling of noise with respect to the second electrode (E2) due to the gate electrode (GE) may be reduced.

For example, if the capacitance is produced only between the gate electrode (GE) and the second electrode (E2), noise attributable to the gate electrode (GE) may be fully coupled to the second electrode (E2). However, because the gate electrode (GE) produces capacitance both with the second electrode (E2) and with the noise reduction electrode (NRE), a portion of the noise due to the gate electrode (GE) may be discharged through the noise reduction electrode (NRE) by voltage distribution.

Therefore, the noise of the second electrode (E2) generated by the coupling with the signal applied to the gate electrode (GE) can be reduced. Moreover, because the noise of the second electrode (E2) generated by the coupling with the signal applied to the gate electrode (GE) is reduced, the noise of the touch electrode (TE), which is coupled with the noise of the second electrode (E2), can be reduced.

As described above, by reducing noise coupled with the second electrode (E2) positioned under and adjacent to the touch electrode (TE), it is possible to reduce the noise of the touch electrode (TE), which is coupled with the second electrode (E2), thereby improving the performance of touch sensing. In addition, noise introduced by the electrode, as well as by the signal line positioned under the second electrode (E2), can be reduced using the noise reduction electrode (NRE).

With reference to FIG. 15, a noise reduction electrode (NRE) is arranged in the area where the first electrode (E1) is not provided, in the layer in which the first electrode (E1) is arranged. In addition, the noise reduction electrode (NRE) may be arranged to be separate from the first electrode (E1).

If a voltage, a signal, or the like is applied to the first electrode (E1) through a signal line, capacitance (C21) may be produced between the first electrode (E1) and the second electrode (E2). In addition, noise caused by the signal applied to the first electrode (E1) may be coupled to the second electrode (E2).

In this case, because the first electrode (E1) is able to produce capacitance (C22) with respect to the noise reduction electrode (NRE), at least a portion of the noise of the first electrode (E1) may be discharged through the noise reduction electrode (NRE).

Therefore, the degree of coupling of noise of the first electrode (E1) with respect to the second electrode (E2) may be reduced. In addition, as the noise coupled to the second electrode (E2) is reduced, the noise of the touch electrode (TE), which is coupled with the noise of the second electrode (E2), may be reduced.

Although the above-described examples illustrate the case where the gate electrode (GE) is used as a signal line, even in the case where the source/drain electrode (SDE) is used as a signal line, it is possible to prevent an increase in the noise of the touch electrode (TE) by arranging the noise reduction electrode (NRE).

With reference to FIG. 16, the planarization layer (PLN) is arranged on the source/drain electrode (SDE) constituting a signal line, and a first electrode (E1) and a noise reduction electrode (NRE) are arranged on the planarization layer (PLN).

As various signals are applied to the source/drain electrode (SDE), capacitance (C31) may be produced between the source/drain electrode (SDE) and a second electrode (E2). In addition, noise may occur in the second electrode (E2) due to the coupling with the signal applied to the source/drain electrode (SDE).

Because the noise reduction electrode (NRE) is arranged on the source/drain electrode (SDE), capacitance (C32) may be produced between the source/drain electrode (SDE) and the noise reduction electrode (NRE). Therefore, at least a portion of the noise due to the signal applied to the source/drain electrode (SDE) may be discharged through the noise reduction electrode (NRE).

For example, because the source/drain electrode (SDE) produces the capacitance (C31) together with the second electrode (E2) and the capacitance (C32) together with the noise reduction electrode (NRE), the noise caused by the signal applied to the source/drain electrode (SDE) may be discharged through the noise reduction electrode (NRE) by voltage distribution. Further, because a portion of the noise caused by the signal applied to the source/drain electrode (SDE) is discharged, the noise coupled to the second electrode (E2) may be reduced.

Thus, it is possible to avoid an increase in the noise of the touch electrode (TE) by reducing the degree of coupling of noise of the second electrodes (E2) with the touch electrode (TE), which produces capacitance (Ct) together with the second electrode (E2).

For example, in the embodiments of the present disclosure, the noise reduction electrode (NRE) may be arranged between the second electrode (E2) and the signal line and the electrode, which are located below the second electrode (E2), thereby reducing the noise coupled to the second electrode (E2) due to the signal line and the electrode. In addition, by reducing the noise coupled to the second electrode (E2), it is possible to prevent an increase in the noise of a touch-sensing signal due to the coupling of the noise of the second electrode (E2) with the touch electrode (TE).

Although the noise coupled to the second electrode (E2) can be reduced through arrangement of the noise reduction electrode (NRE), capacitance (C4) may be produced between the noise reduction electrode (NRE) and the second electrode (E2) when a constant voltage is applied to the noise reduction electrode (NRE). Accordingly, the embodiments of the present disclosure may prevent an increase in the load due to the noise reduction electrode (NRE) by applying, to the noise reduction electrode (NRE), a voltage of the same level as the voltage applied to the second electrode (E2), thereby minimizing or reducing the noise coupled to the second electrode (E2).

Figure 17:
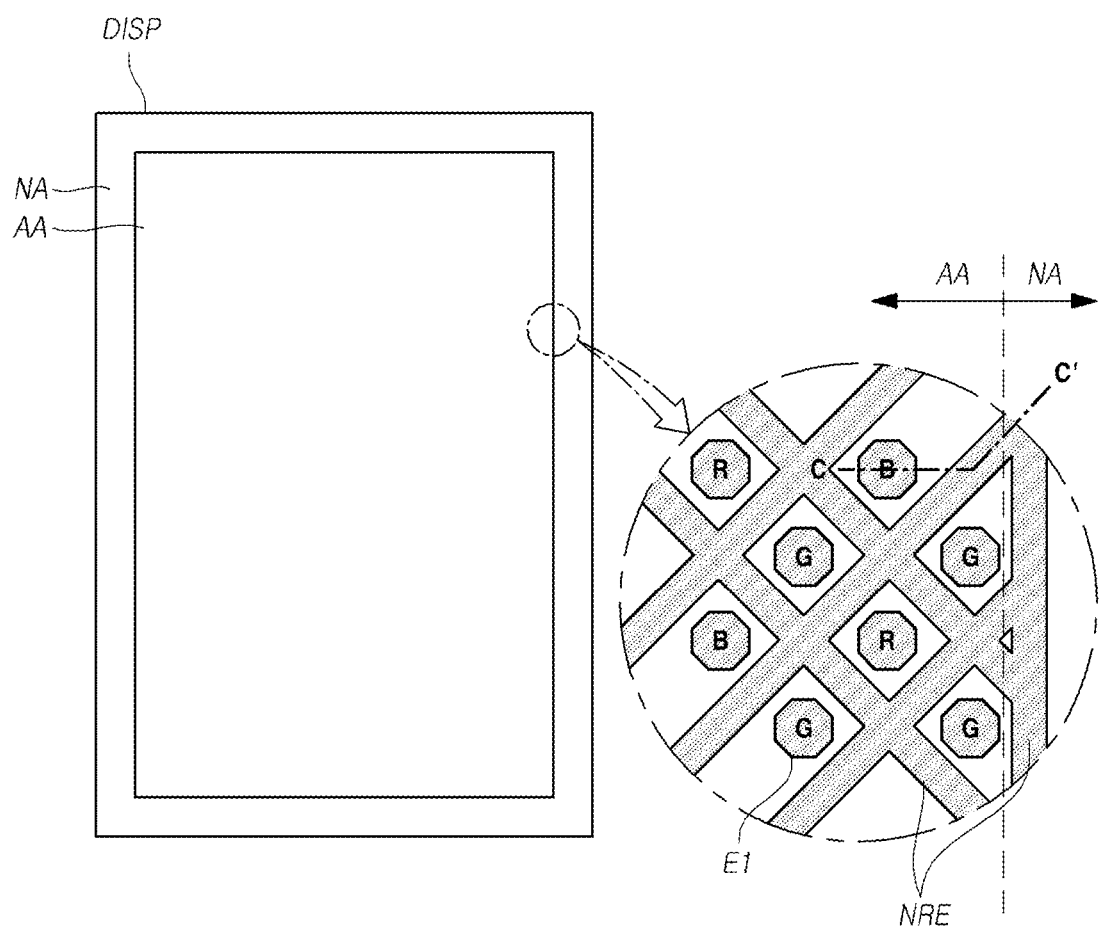
FIG. 17 is a view illustrating an example of a planar structure in which a noise reduction electrode is arranged in an active area and a non-active area of a display panel according to embodiments of the present disclosure.

FIG. 17 is a view illustrating an example of a planar structure in which a noise reduction electrode (NRE) is arranged in an active area (AA) and a non-active area (NA) of a display panel (DISP) according to embodiments of the present disclosure.

With reference to FIG. 17, a plurality of first electrodes (E1) may be arranged in the active area (AA) of the display panel (DISP), and a noise reduction electrode (NRE) may be arranged in the area where the first electrode (E1) is not provided. In addition, a part of the noise reduction electrode (NRE) may be arranged in the non-active area (NA) of the display panel (DISP).

For example, noise coupled to the second electrode (E2) may be reduced by arranging the noise reduction electrode (NRE) in the active area (AA). In addition, a part of the noise reduction electrode (NRE) may be arranged in the non-active area (NA), thereby obtaining a structure in which a voltage of the same level as the voltage applied to the second electrode (E2) is applied to the noise reduction electrode (NRE).

Figure 18:
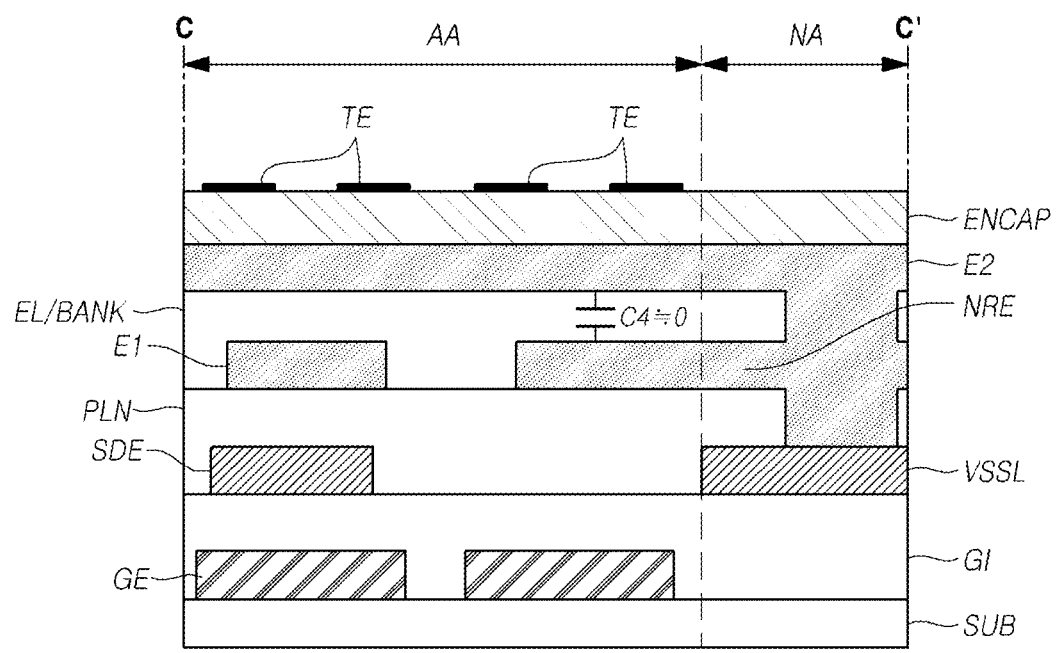
FIGS. 18 and 19 are views illustrating examples of a cross-sectional structure taken along line C-C' in FIG. 17.
Figure 19:
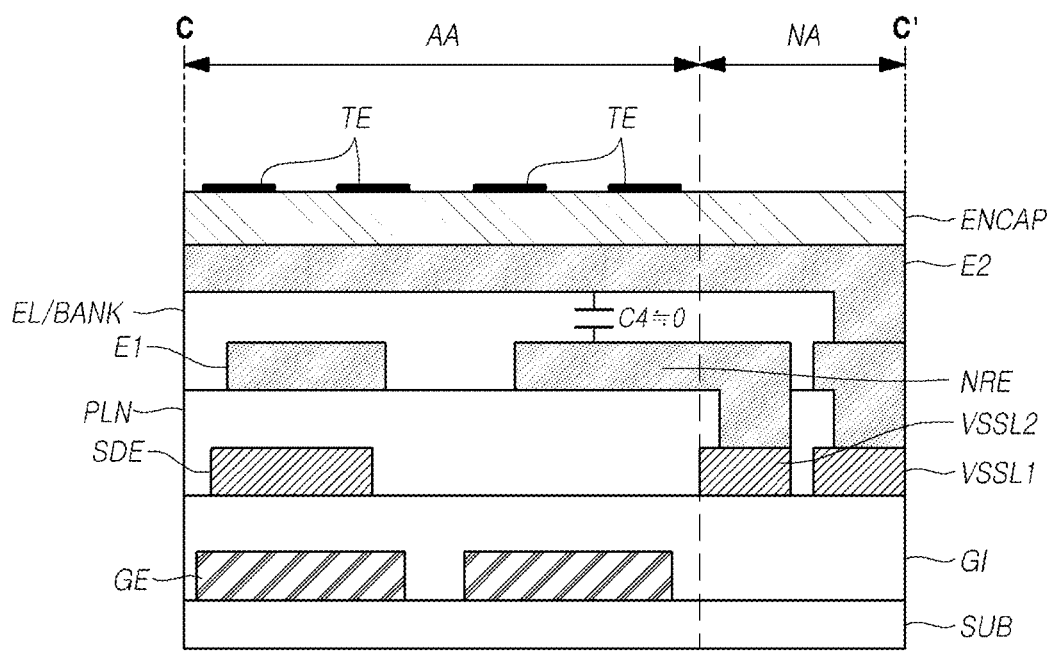

Examples of a structure in which a voltage of the same level as the voltage applied to the second electrode (E2) is applied through the noise reduction electrode (NRE) arranged in the non-active area (NA) will be described with reference to FIGS. 18 and 19. FIGS. 18 and 19 are views illustrating examples of a cross-sectional structure taken along line C-C' in FIG. 17.

With reference to FIG. 18, a gate electrode (GE), a source/drain electrode (SDE), and the like are arranged on a substrate (SUB) in an active area (AA) of a display panel (DISP). In addition, a first electrode (E1) is arranged on the source/drain electrode (SDE), and a noise reduction electrode (NRE) is arranged in the area where the first electrode (E1) is not provided. Then, a second electrode (E2), touch electrodes (TE), and the like may be arranged on the first electrode (E1) and the noise reduction electrode (NRE).

Signal lines including gate electrodes (GE) or source/drain electrodes (SDE) may be arranged on the non-active area (NA) of the display panel (DISP). Among the signal lines, a base voltage line (VSSL) for applying a base voltage (VSS) to the second electrode (E2) may be arranged.

The base voltage line (VSSL) may include, for example, a source/drain electrode (SDE). The base voltage line (VSSL) may be connected to the second electrode (E2) through a contact hole or the like, thereby supplying a base voltage (VSS) to the second electrode (E2).

A part of the noise reduction electrode (NRE) arranged in the non-active area (NA) may be connected to the second electrode (E2) or the base voltage line (VSSL). For example, the noise reduction electrode (NRE) may be connected to the second electrode (E2) through a contact hole in the non-active area (NA). Alternatively, the noise reduction electrode (NRE) may be connected to the base voltage line (VSSL) through a contact hole in the non-active area (NA). Alternatively, the noise reduction electrode (NRE) may be connected both to the second electrode (E2) and to the base voltage line (VSSL).

For example, a part of the noise reduction electrode (NRE) may be arranged in the non-active area (NA), and the noise reduction electrode (NRE) arranged in the non-active area (NA) may be connected to the second electrode (E2) and/or the base voltage line (VSSL) for supplying a base voltage (VSS) to the second electrode (E2).

Therefore, the noise reduction electrode (NRE) may be arranged to be insulated from the second electrode (E2) in the active area (AA), and may be arranged to be connected to the second electrode (E2) in the non-active area (NA). In addition, a base voltage (VSS), supplied to the second electrode (E2), may be applied to the noise reduction electrode (NRE) according to the above structure.

As described above, the same voltage as the voltage applied to the second electrode (E2) may be applied to the noise reduction electrode (NRE), thereby avoiding the formation of capacitance (C4) between the noise reduction electrode (NRE) and the second electrode (E2). It is possible to prevent an increase in the load due to the noise reduction electrode (NRE) and to reduce the noise coupled to the second electrode (E2) by avoiding formation of capacitance between the noise reduction electrode (NRE) and the second electrode (E2). Alternatively, a voltage of the same level as the voltage applied to the second electrode (E2) may be applied to the noise reduction electrode (NRE) through a separate signal line arranged in the non-active area (NA).

With reference to FIG. 19, in an active area (AA) of a display panel (DISP), a gate electrode (GE), a source/drain electrode (SDE), and the like may be arranged on a substrate (SUB), and a first electrode (E1) and a noise reduction electrode (NRE) may be arranged on the source/drain electrode (SDE). In addition, a second electrode (E2), touch electrodes (TE), and the like may be arranged on the first electrode (E1) and the noise reduction electrode (NRE).

In the active area (AA), the noise reduction electrode (NRE) may be arranged to be separate from the first electrode (E1) and to be insulated from the second electrode (E2).

In the non-active area (NA) of the display panel (DISP), the second electrode (E2) may be connected to a first base voltage line (VSSL1) through a contact hole. For example, the first base voltage line (VSSL1) may include a source/drain electrode (SDE). In addition, the second electrode (E2) may be directly connected to the first base voltage line (VSSL1) through a contact hole, and may be connected to the first electrode (E1) through an electrode arranged in the same layer.

A second base voltage line (VSSL2) connected to the noise reduction electrode (NRE) may be arranged in the non-active area (NA) of the display panel (DISP). The second base voltage line (VSSL2) may include, for example, a source/drain electrode (SDE), and may be arranged to be separate from the first base voltage line (VSSL1).

In addition, the noise reduction electrode (NRE) may be connected to the second base voltage line (VSSL2) arranged in the non-active area (NA) through a contact hole or the like. Therefore, the noise reduction electrode (NRE) may receive a voltage of the same level as the voltage applied to the second electrode (E2) through the second base voltage line (VSSL2). Accordingly, it is possible to avoid the capacitance produced between the noise reduction electrode (NRE) and the second electrode (E2). In addition, it is possible to reduce the noise coupled to the second electrode (E2) by arranging the noise reduction electrode (NRE).

According to the embodiments of the present disclosure described above, it is possible to reduce noise of the second electrode (E2), which is coupled by a signal applied to a signal line, by arranging the noise reduction electrode (NRE) between the second electrode (E2) and the signal line in the active area (AA) of the display panel (DISP). Accordingly, the noise of the touch electrode (TE), which is introduced by the noise of the second electrode (E2), can be reduced, thereby improving the touch sensing performance.

In addition, the noise reduction electrode (NRE) can be easily arranged without adding a mask by arranging the noise reduction electrode (NRE) in the area where the first electrode (E1) is not provided, in the layer in which the first electrode (E1) is arranged. Further, it is possible to prevent an increase in the load due to the noise reduction electrode (NRE) by applying, to the noise reduction electrode (NRE), a voltage of the same level as the voltage applied to the second electrode (E2), thereby reducing the noise coupled to the second electrode (E2) and reducing the noise of the touch electrode (TE) due to the noise of the second electrode (E2).

It will be apparent to those skilled in the art that various modifications and variations can be made in the touch display panel and the touch display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A touch display device, comprising:
    a substrate defining an active area having a plurality of subpixels therein and displaying an image, and a non-active area around the active area;
    a touch pad on the substrate in the non-active area;
    a plurality of signal lines on the substrate;
    a signal line insulation layer on the plurality of signal lines;
    a plurality of first electrodes on the signal line insulation layer;
    at least one noise reduction electrode on the signal line insulation layer and in at least a portion of an area other than the area corresponding to the plurality of first electrodes in the active area;
    a second electrode over the plurality of first electrodes and the at least one noise reduction electrode;
    an encapsulation layer on the second electrode;

a plurality of touch lines on the encapsulation layer and electrically connected to the touch pad; and
a plurality of touch electrodes on the encapsulation layer and electrically connected to at least one of the plurality of touch lines,
wherein the encapsulation layer has a sloped surface between the touch pad and the touch electrodes,
wherein the plurality of touch lines is arranged on the sloped surface of the encapsulation layer to have a slope corresponding to the sloped surface of the encapsulation layer,
wherein a portion of the at least one noise reduction electrode extends from the active area to the non-active area configured to receive a voltage of the same level as the voltage applied to the second electrode, and
wherein the second electrode is electrically connected to the at least one noise reduction electrode in the non-active area through a contact hole of an insulation layer between the second electrode and the at least one noise reduction electrode.

2. The touch display device of claim 1, wherein the at least one noise reduction electrode is in the active area separated from the plurality of first electrodes and to be insulated from the second electrode.

3. The touch display device of claim 1, wherein the at least one noise reduction electrode includes a same material as the plurality of first electrodes.

4. The touch display device of claim 1, wherein the voltage applied to the at least one noise reduction electrode is different from a signal applied to at least one of the plurality of signal lines.

5. The touch display device of claim 4, further comprising:
a first signal line in the non-active area and connected to the second electrode; and
a second signal line in the non-active area and connected to the at least one noise reduction electrode,
wherein the first signal line and the second signal line are separated from each other.

6. The touch display device of claim 4, wherein the at least one noise reduction electrode is connected to the second electrode in the non-active area.

7. The touch display device of claim 1, wherein at least one of the plurality of signal lines defines a first capacitance with the second electrode, and defines a second capacitance with the at least one noise reduction electrode.

8. The touch display device of claim 1, wherein the plurality of touch electrodes includes mesh-type touch electrodes comprising at least one opening and the at least one opening is disposed corresponding to the plurality of subpixels in the active area such that light emitted from the plurality of subpixels is transmitted through the at least one opening.

9. The touch display device of claim 1, wherein the plurality of touch electrodes includes mesh-type touch electrodes defining at least one opening, wherein the at least one noise reduction electrode includes a mesh-type electrode defining at least one opening, and wherein a portion of the at least one opening of the touch electrode overlaps a portion of the opening of the noise reduction electrode.

10. The touch display device of claim 1, wherein the plurality of touch electrodes includes mesh-type touch electrodes comprising at least one opening, and
wherein the at least one opening is vertically aligned with a space between the first electrode and the at least one noise reduction electrode.

11. The touch display device of claim 1, wherein the at least one noise reduction electrode overlaps the second electrode.

12. The touch display device of claim 1, further comprising a dam area arranged on the non-active area, wherein the plurality of touch lines cross over the dam area.

13. A touch display panel, comprising:
a substrate defining an active area having a plurality of subpixels therein and displaying an image, and a non-active area around the active area;
a plurality of signal lines on the substrate;
a signal line insulation layer on the plurality of signal lines;
a plurality of first electrodes on the signal line insulation layer;
at least one noise reduction electrode on the signal line insulation layer and in at least a portion of an area other than an area having the plurality of first electrodes in the active area;
a second electrode on the plurality of first electrodes and spaced apart from the plurality of first electrodes;
an encapsulation portion on the second electrode; and
a plurality of touch electrodes on the encapsulation portion,
wherein a portion of the at least one noise reduction electrode extends from the active area to the non-active area configured to receive a voltage of the same level as the voltage applied to the second electrode, and
wherein the second electrode is electrically connected to the at least one noise reduction electrode in the non-active area through a contact hole of an insulation layer between the second electrode and the at least one noise reduction electrode.

14. The touch display panel of claim 13, wherein the at least one noise reduction electrode is in the active area, the at least one noise reduction electrode being separated from the plurality of first electrodes and insulated from the second electrode.

15. The touch display panel of claim 13, wherein the voltage applied to the at least one noise reduction electrode is different from a signal applied to at least one of the plurality of signal lines.

16. The touch display panel of claim 15, further comprising:
a first signal line connected to the second electrode; and
a second signal line connected to the at least one noise reduction electrode,
wherein the first signal line and the second signal line are separated from each other.

17. The touch display panel of claim 15, wherein the at least one noise reduction electrode and the second electrode are insulated from each other in the active area, and are connected to each other in the non-active area.

* * * * *